(12) United States Patent
Oh et al.

(10) Patent No.: US 12,395,775 B2
(45) Date of Patent: Aug. 19, 2025

(54) ELECTRONIC DEVICE COMPRISING TOUCH ELECTRODE

(71) Applicant: SAMSUNG ELECTRONICS CO., LTD., Suwon-si (KR)

(72) Inventors: Juntaek Oh, Suwon-si (KR); Jaewon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 18/099,449

(22) Filed: Jan. 20, 2023

(65) Prior Publication Data

US 2023/0156395 A1    May 18, 2023

Related U.S. Application Data

(63) Continuation of application No. PCT/KR2021/009341, filed on Jul. 20, 2021.

(30) Foreign Application Priority Data

Jul. 23, 2020    (KR) .................. 10-2020-0091532

(51) Int. Cl.
*H04R 1/00* (2006.01)
*H04R 1/10* (2006.01)

(52) U.S. Cl.
CPC .................. *H04R 1/1041* (2013.01)

(58) Field of Classification Search
CPC ........ H04R 1/1041; H04R 5/04; H04R 5/033; H04R 10/25; H04R 2420/07
See application file for complete search history.

(56) References Cited

U.S. PATENT DOCUMENTS

| | | | |
|---|---|---|---|
| 7,925,029 | B2 | 4/2011 | Hollemans et al. |
| 9,794,675 | B2 | 10/2017 | Rye et al. |

(Continued)

FOREIGN PATENT DOCUMENTS

| | | |
|---|---|---|
| CN | 109889958 | 6/2019 |
| CN | 209845247 | 12/2019 |

(Continued)

OTHER PUBLICATIONS

International Search Report for PCT/KR2021/009341 mailed Nov. 16, 2021, 5 pages.

(Continued)

*Primary Examiner* — Rasha S Al Aubaidi
(74) *Attorney, Agent, or Firm* — Nixon & Vanderhye, P.C.

(57) ABSTRACT

Various embodiments relate to an electronic device comprising a touch electrode. The electronic device may comprise: a housing comprising a first microphone hole; a first printed circuit board positioned inside the housing; a touch sensor circuit comprising a touch sensor positioned on the first printed circuit board; at least one microphone configured to collect external sound; at least one second printed circuit board electrically connected to the first printed circuit board, including a first surface facing an interior of the housing, in which the microphone is positioned, and comprises a second microphone hole, and a first touch electrode electrically connected to the touch sensor circuit by being positioned on a second surface, which is a surface opposite the first surface, to surround the second microphone hole, wherein the second printed circuit board is disposed between the housing and the first printed circuit board so that the second microphone hole corresponds to the first microphone hole; and a conductive pattern positioned to cover at least a (Continued)

portion of the first touch electrode, and electrically connected to the touch sensor circuit.

20 Claims, 20 Drawing Sheets

(56) References Cited

U.S. PATENT DOCUMENTS

| | | | |
|---|---|---|---|
| 9,949,014 | B2 | 4/2018 | Cramer et al. |
| 10,003,881 | B2 | 6/2018 | Cousins et al. |
| 10,433,043 | B2 | 10/2019 | Hankey et al. |
| 11,442,587 | B2 | 9/2022 | Song et al. |
| 2016/0050474 | A1 | 2/2016 | Rye et al. |
| 2018/0098146 | A1 | 4/2018 | Lin et al. |
| 2018/0352320 | A1 | 12/2018 | Lin et al. |
| 2019/0103661 | A1 | 4/2019 | Cousins et al. |
| 2019/0297408 | A1 | 9/2019 | Mohammadi et al. |
| 2020/0045422 | A1 | 2/2020 | Chiang et al. |
| 2020/0077176 | A1 | 3/2020 | Powell et al. |
| 2020/0091590 | A1 | 3/2020 | Su et al. |
| 2020/0128317 | A1 | 4/2020 | Feldman |
| 2020/0193127 | A1 | 6/2020 | Kim et al. |
| 2023/0188878 | A1* | 6/2023 | Lee .................. H04M 1/0277 381/91 |

FOREIGN PATENT DOCUMENTS

| | | |
|---|---|---|
| CN | 210579120 | 5/2020 |
| CN | 111309096 | 6/2020 |
| CN | 210840002 | 6/2020 |
| KR | 10-2019-0095215 | 8/2019 |
| KR | 10-2058670 | 12/2019 |
| KR | 10-2059417 | 12/2019 |
| WO | 2019/032196 | 2/2019 |
| WO | 2020/080740 | 4/2020 |
| WO | 2021/162324 | 8/2021 |

OTHER PUBLICATIONS

Written Opinion of the ISA for PCT/KR2021/009341 mailed Nov. 16, 2021, 3 pages.
Extended European Search Report dated Nov. 21, 2023 issued in European Patent Application No. 21845907.1.
Korean Notice of Patent Grant issued May 31, 2024 in corresponding Korean Patent Application No. 10-2020-0091532.
Indian Office Action issued Jun. 28, 2024 in corresponding Indian Patent Application No. 202327006480.
Indian Hearing Notice issued Jan. 8, 2025 in corresponding Indian Patent Application No. 202327006480.
Office Action dated Apr. 19, 2025 in Chinese Application No. 202180059159.9 and English-language translation.

* cited by examiner

ELECTRONIC DEVICE COMPRISING TOUCH ELECTRODE

CROSS-REFERENCE TO RELATED APPLICATIONS

This application is a continuation of International Application No. PCT/KR2021/009341 designating the United States, filed on Jul. 20, 2021, in the Korean Intellectual Property Receiving Office and claiming priority to Korean Patent Application No. 10-2020-0091532, filed on Jul. 23, 2020, in the Korean Intellectual Property Office, the disclosures of which are incorporated by reference herein in their entireties.

BACKGROUND

Field

The disclosure relates to an electronic device including a touch electrode.

Description of Related Art

Electronic devices (e.g., a mobile terminal, a smartphone, or a wearable device) may provide various functions. For example, in addition to a basic voice communication function, a smartphone may provide various functions such as a short-range wireless communication (e.g., a Bluetooth™, a Wi-Fi, or a near field communication) function, a mobile communication (third generation (3G), 4G, or 5G) function, a music or video playback function, a photographing function, or a navigation function.

Interest in various accessory devices operating in conjunction with the electronic devices is increasing. For example, recently, interest in an in-ear type wireless ear set is increasing.

In an in-ear type wireless ear set, various components (e.g., an antenna, a touch electrode, and/or a microphone) may be arranged on a portion exposed to the outside when worn on a user's ear. However, due to a small size of the wireless ear set, there may be difficulty in arranging a plurality of components on the portion exposed to the outside. For example, the size of the touch electrode may be reduced, and thus touch performance may be deteriorated.

SUMMARY

Embodiments of the disclosure may provide an electronic device including a touch electrode capable of improving touch sensitivity by expanding a touch area.

An electronic device according to various example embodiments, may include: a housing including a first microphone hole; a first printed circuit board positioned in the housing; a touch sensor module comprising a touch sensor positioned on the first printed circuit board; at least one microphone configured to capture external sound; at least one second printed circuit board electrically connected to the first printed circuit board, having the microphone positioned on a first surface oriented toward the interior of the housing, including a second microphone hole and a first touch electrode positioned on a second surface opposite to the first surface to surround the second microphone hole and electrically connected to the touch sensor module, and disposed between the housing and the first printed circuit board to allow the second microphone hole to correspond to the first microphone hole; and a conductive pattern positioned to surround at least a portion of the first touch electrode and electrically connected to the touch sensor module.

An electronic device according to various example embodiments, may include: a housing including a first microphone hole; a first printed circuit board positioned in the housing; a touch sensor module comprising a touch sensor positioned on the first printed circuit board; at least one microphone configured to capture external sound; at least one second printed circuit board electrically connected to the first printed circuit board, having the microphone positioned on a first surface oriented toward the interior of the housing, including a second microphone hole and a touch electrode positioned on a second surface opposite to the first surface to surround the second microphone hole and electrically connected to the touch sensor module, and disposed between the housing and the first printed circuit board to allow the second microphone hole to correspond to the first microphone hole; a connection member positioned on the first printed circuit board; and a conductive pattern electrically connected to the touch sensor module positioned on the first printed circuit board via the connection member.

An electronic device according to various example embodiments, may include: a housing including a first microphone hole; a first printed circuit board positioned in the housing; a touch sensor module comprising a touch sensor positioned on the first printed circuit board; a wireless communication module comprising communication circuitry positioned on the first printed circuit board and configured to transmit and/or receive a wireless signal; at least one microphone configured to capture external sound; at least one second printed circuit board electrically connected to the first printed circuit board, having the microphone positioned on a first surface oriented toward the interior of the housing, including a second microphone hole and a touch electrode positioned on a second surface opposite to the first surface to surround the second microphone hole and electrically connected to the touch sensor module, and disposed between the housing and the first printed circuit board to allow the second microphone hole to correspond to the first microphone hole; and a conductive pattern positioned in the housing and electrically connected to the touch sensor module and the wireless communication module.

Various example embodiments may include a touch electrode in a partial area of a component (e.g., a rigid flexible printed circuit board (RFPCB)) in which a microphone is disposed, and thus may not need a separate component (e.g., an FPCB or a base member (or a carrier)) for a touch electrode, thereby securing a mount place. This may reduce constraints on the design/arrangement of an antenna or a touch pattern. In addition, various example embodiments may expand a touch area and improve touch sensitivity due to the expansion of the touch area.

Effects obtainable in the disclosure may not be limited to the above-mentioned effects, and other effects not mentioned may be clearly understood by a person skilled in the art to which the disclosure belongs from the descriptions below.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
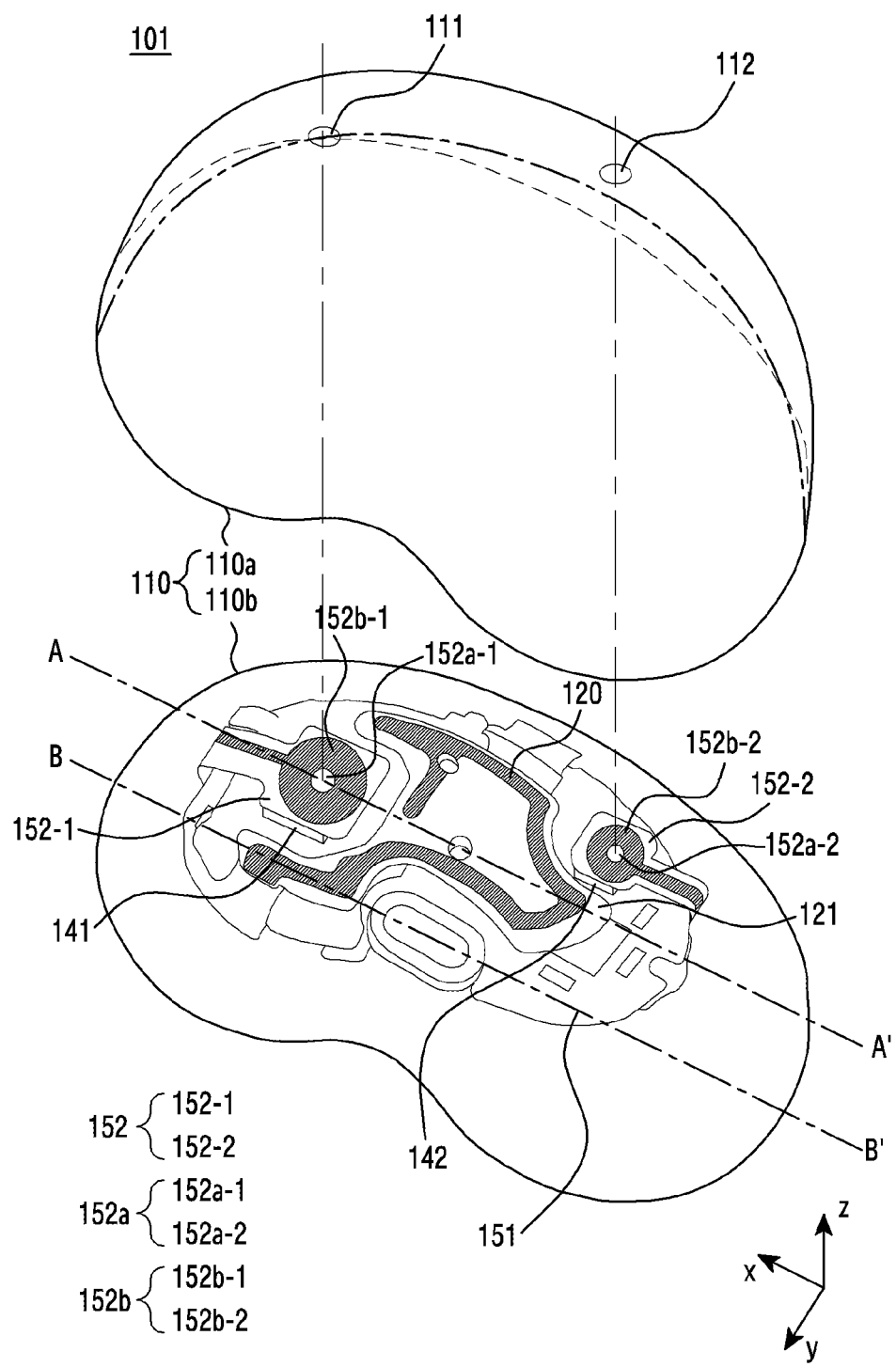
FIG. 1A is an exploded perspective view of an electronic device according to various embodiments.

Hereinafter, various example embodiments are explained with reference to accompanying drawings. In the disclosure, example embodiments are illustrated in the drawings and the related detailed descriptions are described, but this is not intended to limit the various example embodiments to a specific form. For example, it will be apparent to one skilled in the art to which the disclosure belongs that the example embodiments may be variously changed.

Figure 1B:
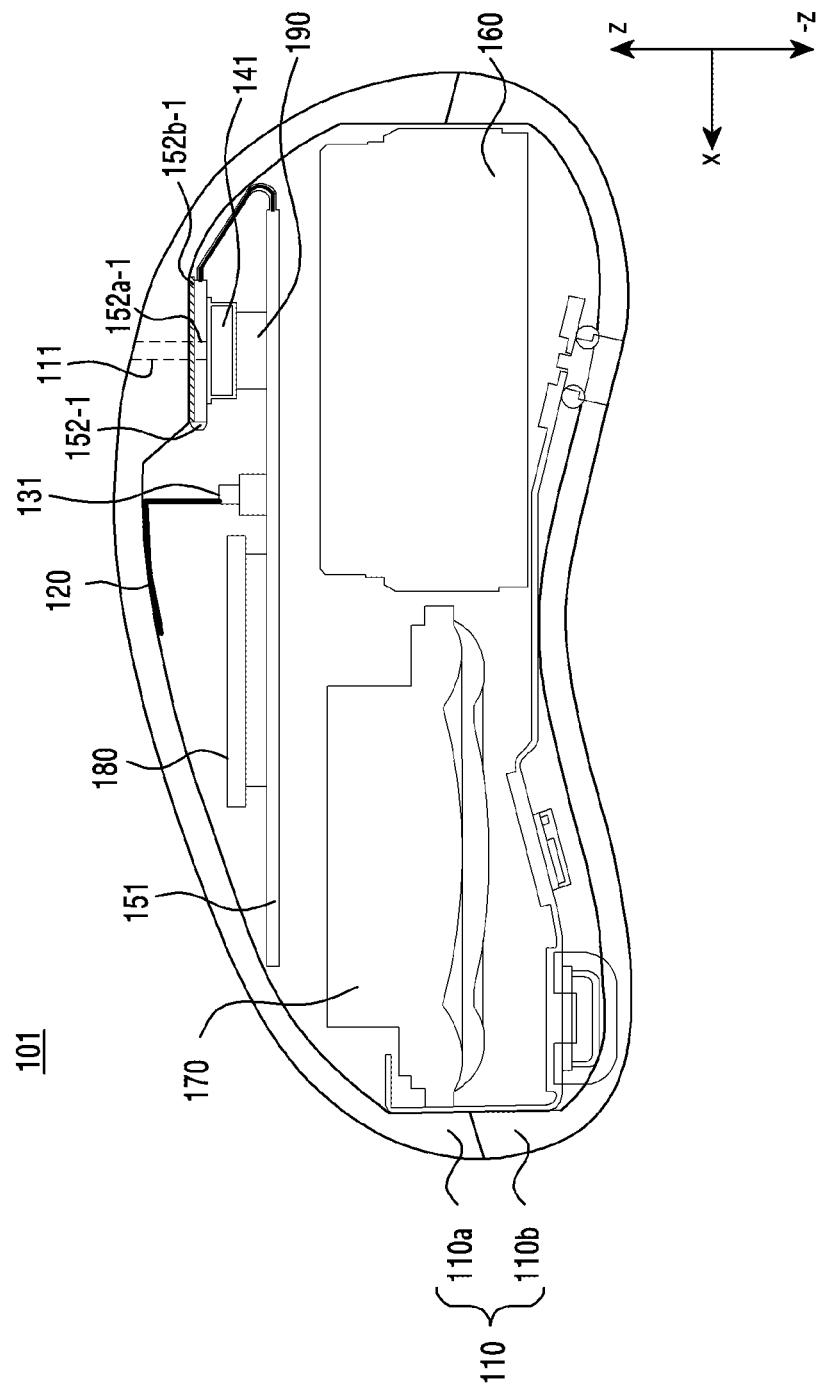
FIG. 1B is a cross-sectional view of an electronic device according to various embodiments.
Figure 1C:
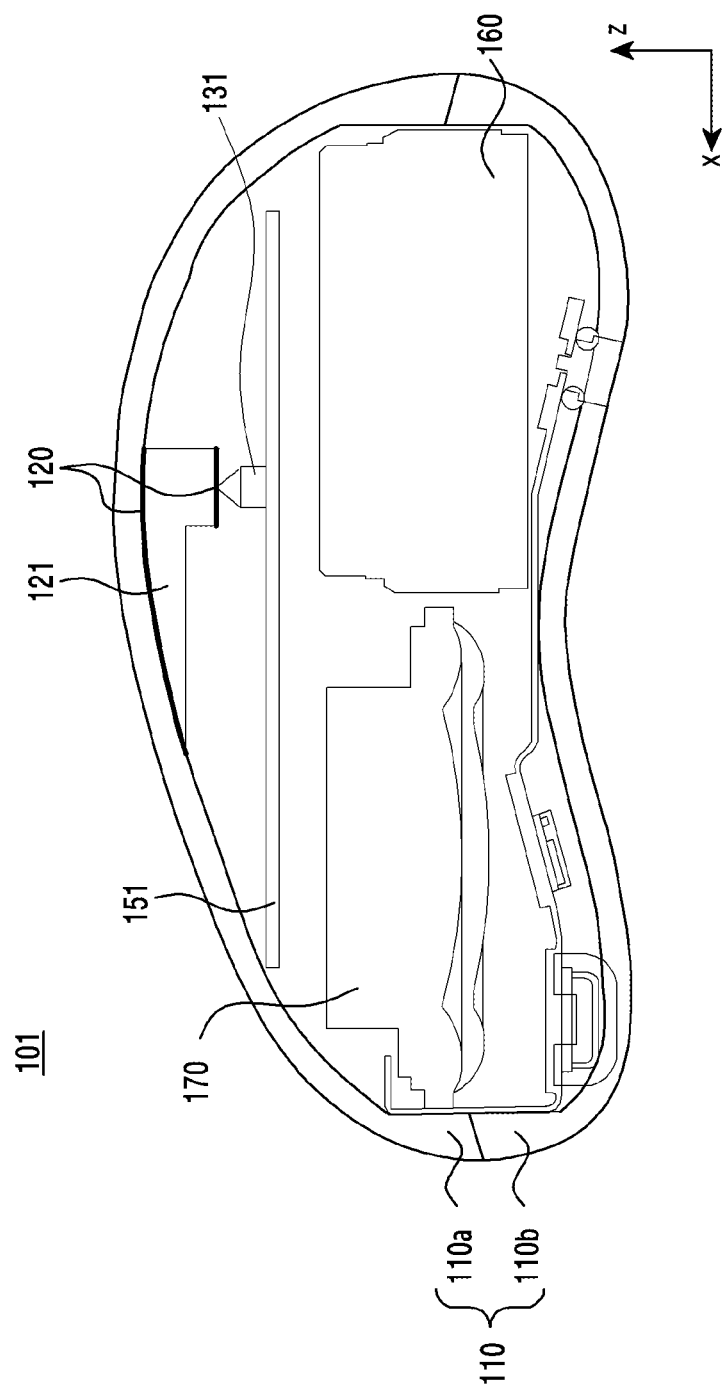
FIG. 1C is a cross-sectional view of an electronic device according to various embodiments.

FIG. 1A is an exploded perspective view of an electronic device according to various embodiments, and FIG. 1B and FIG. 1C are cross-sectional views of an electronic device according to various embodiments. For example, the cross-sectional view of FIG. 1B is a cross-sectional view of the electronic device taken along axis A-A' of FIG. 1A and viewed in a Y-axis direction, and the cross-sectional view of FIG. 1C is a cross-sectional view of the electronic device taken along axis B-B' of FIG. 1A and viewed in a Y-axis direction.

Referring to FIGS. 1A, 1B and FIG. 1C, an electronic device 101 according to an embodiment may be a wearable wireless communication device. For example, the electronic device 101 may not be limited, but may be an in-ear type Bluetooth device (e.g., an earset).

An electronic device 101 according to an embodiment may include a housing 110, a conductive pattern 120, a base member (e.g., including a support or including supporting structure) 121, a connection member (e.g., including a conductive material) 131, a first microphone 141, a second microphone 142, a first printed circuit board 151, a second printed circuit board 152, a battery 160, a speaker 170, a wireless communication module (e.g., including communication circuitry) 180, and/or a touch sensor module (e.g., including a touch sensor) 190. According to an embodiment, the term "touch sensor module" may be replaced by the term "touch sensor circuit" or "touch sensor circuitry." For example, the electronic device may include a touch sensor circuit.

According to an embodiment, the housing 110 may include various components of the electronic device 101 therein. At least a portion of the housing 110 may be configured of various materials such as polymer, ceramic, or metal. The housing 110 may include a first portion 110b exposed to the outside of a user's body and a second portion 110b inserted into the interior (e.g., an external ear) of a part of the body when the user wears the electronic device on a part of the body (e.g., an ear). For example, the housing 110 may include a plurality of couplable portions (e.g., a first portion 110a or a second portion 110b), and when the couplable portions are coupled to each other and be worn on a part (e.g., an ear) of a user's body, the first portion may be more exposed visually to the outside of the user's body than the second portion 110b.

According to an embodiment, the housing 110 may include at least one microphone configured to acquire audio sound and include at least one microphone hole for the at least one microphone. For example, the electronic device 101 may include a first microphone 141 and a second microphone 142, and a first-first microphone hole 111 and a first-second microphone hole 112 may be positioned through the first portion 110a of the housing 110.

According to an embodiment, the battery 160 may provide electrical power to at least one component (e.g., a wireless communication module 180, a touch sensor module 190, a memory (not shown), or a processor (not shown)) of the electronic device 101. According to an embodiment, the battery 160 may include, for example, a non-rechargeable primary battery, a rechargeable secondary battery, or a fuel cell.

According to an embodiment, the speaker 170 may receive a sound signal from an audio module (not shown) positioned on the first printed circuit board 151 and output the received sound signal to the outside of the electronic device 101. The sound signal may be associated with multimedia playback, recording playback, or call reception. The speaker 170 may be disposed (e.g., disposed to be oriented toward a rear surface (e.g., −Z-axis direction of FIG. 1B) of the second portion 110b) at the housing 110 to output a sound signal to the interior of a body (e.g., an ear) at the time of the wearing of the electronic device 101.

According to an embodiment, the first printed circuit board (PCB) 151 may be positioned in the housing 110. At least a portion of various components of the electronic device 101 may be positioned on the first printed circuit board 151. For example, the wireless communication module 180, the touch sensor module 190, and/or the connection member 131 being in contact with a portion of the conductive pattern 120 may be positioned on the first printed circuit board 151.

According to an embodiment, the connection member 131 may include a conductor/conductive material and be positioned on the first printed circuit board 151 and be in contact with the conductive pattern 120 to allow the conductive pattern 120 to be electrically connected to the wireless communication module 180 and/or the touch sensor module 190. According to an embodiment, the connection member 131 may include a flexible conductive member such as a C clip, a pogo-pin, a spring, conductive poron, conductive rubber, conductive tape, or a copper connector.

According to an embodiment, the touch sensor module 190 may detect touch input via the first portion 110*a*. The touch sensor module 190 may be positioned on the first printed circuit board 151 and be electrically connected to the touch electrode 152*b* and the conductive pattern 120. For example, the touch sensor module 190 may be electrically connected to the conductive pattern 120 via the connection member 131 and be electrically connected to the touch electrode 152*b* via an electrical connection member of the first printed circuit board 151 and the second printed circuit board 152.

According to an embodiment, the wireless communication module 180 may include various communication circuitry and support establishment of a wireless communication channel between the electronic device 101 and an external electronic device (not shown) and wireless communication via the established wireless communication channel. For example, the wireless communication module 180 may support short-range wireless communication (e.g., Bluetooth™, Bluetooth low energy (BLE)). The wireless communication module 180 may be positioned on the first printed circuit board 151. The wireless communication module 180 may be electrically connected to the conductive pattern 120. For example, the wireless communication module 180 may be connected to the conductive pattern 120 via the connection member 131 positioned on the first printed circuit board 151.

According to an embodiment, the conductive pattern 120 may be electrically connected to the touch sensor module 190. The conductive pattern 120 may operate as a touch electrode for touch detection. In addition, the conductive pattern 120 may be electrically connected to the wireless communication module 180 to transmit/receive a wireless signal. For example, the conductive pattern 120 may transmit/receive a wireless signal of the Bluetooth protocol, without being limited thereto. The conductive pattern 120 configured to support touch detection and/or transmission/reception of the wireless signal may be electrically connected to the touch sensor module 190 and/or the wireless communication module 180 via the connection member 131 positioned on the first printed circuit board 151. For example, as illustrated in FIG. 1C and/or FIG. 1B, the conductive pattern 120 may be electrically connected to the wireless communication module 180 and/or the touch sensor module 190 via the connection member 131 positioned on the first printed circuit board 151. According to an embodiment, at least one component (e.g., an inductor) configured to reduce mutual influence may be positioned between the wireless communication module 180 and the touch sensor module 190.

According to an embodiment, the base member 121 may include the conductive pattern 120 on one surface (e.g., an upper surface) thereof as a separate structure positioned in the housing 110. According to an embodiment, the base member 121 may be an injection molded product.

According to an embodiment, the conductive pattern 120 may be positioned on the base member 121 via attachment, deposition, or laser direct structuring (LDS) technology. According to an embodiment, the conductive pattern 120 may be positioned on an inner side surface of the first portion 110*a* of the housing 110 via attachment, deposition, or laser direct structuring (LDS) technology and be connected to the first printed circuit board 151 via the connection member 131. The conductive pattern 120 may include a material (e.g., copper) the same as or similar to that of the touch electrode 152*b* or a material (e.g., at least one of silver, gold, or aluminum) different from that of the touch electrode 152*b*.

According to an embodiment, the conductive pattern 120 may be disposed to surround a portion of the components of the electronic device 101. For example, the conductive pattern 120 may be disposed to surround at least a portion of the touch electrode 152*b*.

According to an embodiment, the second printed circuit board 152 may be electrically connected to the first printed circuit board 151. For example, an end portion of a flexible area of the second printed circuit board 152 may be connected to the first printed circuit board 151 via the connection member (e.g., a connector or soldering). According to an embodiment, the second printed circuit board 152 may be a rigid-flexible PCB (RFPCB) including a rigid area having a rigid property and a flexible region having a flexible property, and the flexible area may be connected to the first printed circuit board 151 via the connection member. According to an embodiment, the first printed circuit board 151, the second printed circuit board 152, and the connection member may be integrally formed, and the first printed circuit board 151 and the second printed circuit board 152 may be the rigid area and the connection member may be the flexible area. According to an embodiment, the second printed circuit board 152 may include a second-first printed circuit board 152-1 on which the first microphone 141 is positioned and a second-second printed circuit board 152-2 on which the second microphone 142 is positioned. For example, the first microphone 141 may be positioned on a first surface of the second-first printed circuit board 152-1, the first surface being oriented toward the interior (e.g., −Z direction) of the housing 110, and the second microphone 142 may be positioned on a first surface of the second-second printed circuit board 152-2. Second surfaces (surfaces opposite to the first surfaces) of the second-first printed circuit board 152-1 and the second-second printed circuit board 152-2 may be adjacent to the first portion 110*a* of the housing 110. For example, the second surfaces of the second-first printed circuit board 152-1 and the second-second printed circuit board 152-2 may be in contact with a portion of an inner side surface of the first portion 110*a* of the housing 110.

According to an embodiment, the second-first printed circuit board 152-1 may include a second-first microphone hole 152*a*-1 and a touch electrode (hereinafter, a first-first touch electrode) 152*b*-1 positioned on the second surface thereof to surround the second-first microphone hole 152*a*-

1. Similarly, the second-second printed circuit board 152-2 may include a second-second microphone hole 152a-2 and a touch electrode (hereinafter, a first-second touch electrode) 152b-2 positioned on the second surface thereof to surround the second-second microphone hole 152a-2. The second-first printed circuit board 152-1 and the second-second printed circuit board 152-2 may be positioned between the housing 110 (e.g., the first portion 110a) and the first printed circuit board 151, with reference to the Z-axis of FIG. 1B. For example, the second-first printed circuit board 152-1 may be positioned between the housing 110 and the first printed circuit board 151 such that the second-first microphone hole 152a-1 corresponds to (to be positioned on the identical or similar axis) the first-first microphone hole 111, and the second-second printed circuit board 152-2 may be positioned between the housing 110 and the first printed circuit board 151 such that the second-second microphone hole 152a-2 corresponds to the first-second microphone hole 112.

According to an embodiment, the second-first printed circuit board 152-1 may include multiple layers, and may include at least partial area of the outermost layer of the multiple layers, the outermost layer being positioned close to the first portion 110a, as a first-first touch electrode 152b-1. Similarly, the second-second printed circuit board 152-2 may include multiple layers, and may include at least partial area of the outermost layer of the multiple layers, the outermost layer being positioned close to the first portion 110a, as a first-second touch electrode 152b-2.

According to an embodiment, the first microphone 141 may be positioned on the first surface of the second-first printed circuit board 152-1, and the second microphone 142 may be positioned on the first surface of the second-second printed circuit board 152-2. The first microphone 141 and the second microphone 142 may receive (collect) external sound (e.g., a user's voice) and transmit the received audio sound to the audio module (not shown).

According to an embodiment, at least partial area of the housing 110a in which at least one of the second-first printed circuit board 152-1 or the second-second printed circuit board 152-2 is positioned may have a thickness smaller than that of another area. For example, a partial area of the housing 110a in which at least one of the second-first printed circuit board 152-1 or the second-second printed circuit board 152-2 is positioned may be thinned out.

Although not illustrated in FIGS. 1A, 1B and 1C, the electronic device 101 may further include a processor and a memory. The processor may include various processing circuitry, be operatively connected to various components of the electronic device 101 and control operations of the electronic device 101. For example, the processor may receive sensing information from the touch sensor module 190 and control, based on the received sensing information, at least a portion of the operation of the electronic device 101. According to an embodiment, the processor may receive a sensed value from at least one sensor (e.g., a proximity sensor, an acceleration sensor, a gyro sensor, a geomagnetic sensor, a magnetic sensor, a gesture sensor, a grip sensor, or a biometric sensor) included in the electronic device 101 to control at least a portion of the operation of the electronic device 101. For example, when the processor detects that the electronic device 101 is worn by a user through the sensor, the processor may activate the touch sensor module 190 and/or the wireless communication module 180. The memory may be operatively connected to the processor and store instructions configured to control the processor to perform the operation of the electronic device 101 at the time of execution. For example, the memory may store instructions configured to allow the processor to perform the operation of detecting touch input of the electronic device at the time of execution. The explanation for the operation of detecting touch input of the electronic device 101 will be described later with reference to FIG. 9 and FIG. 10.

FIGS. 1A, 1B and 1C (which may be referred to as FIG. 1A to FIG. 1C) have illustrated that the electronic device 101 includes two microphones, but an electronic device according to another example may include only one microphone or three microphones or more. For example, another microphone may be positioned in an empty area of the base member 121 or around the base member 121. In addition, FIG. 1A to FIG. 1C have illustrated that the second-first printed circuit board 152-1 and the second-second printed circuit board 152-2 include the first-first touch electrode 152b-1 and the first-second touch electrode 152b-2, respectively, but in an electronic device according to another example, a portion (e.g., the second-first printed circuit board 152-1 including a first microphone 141) of a plurality of second printed circuit boards may include a touch electrode. In addition, the electronic device 101 of FIG. 1A to FIG. 1C may be wirelessly connected to a second electronic device (e.g., an electronic device including a component the same as or similar to that of the electronic device 101) to support stereo output.

Figure 1D:
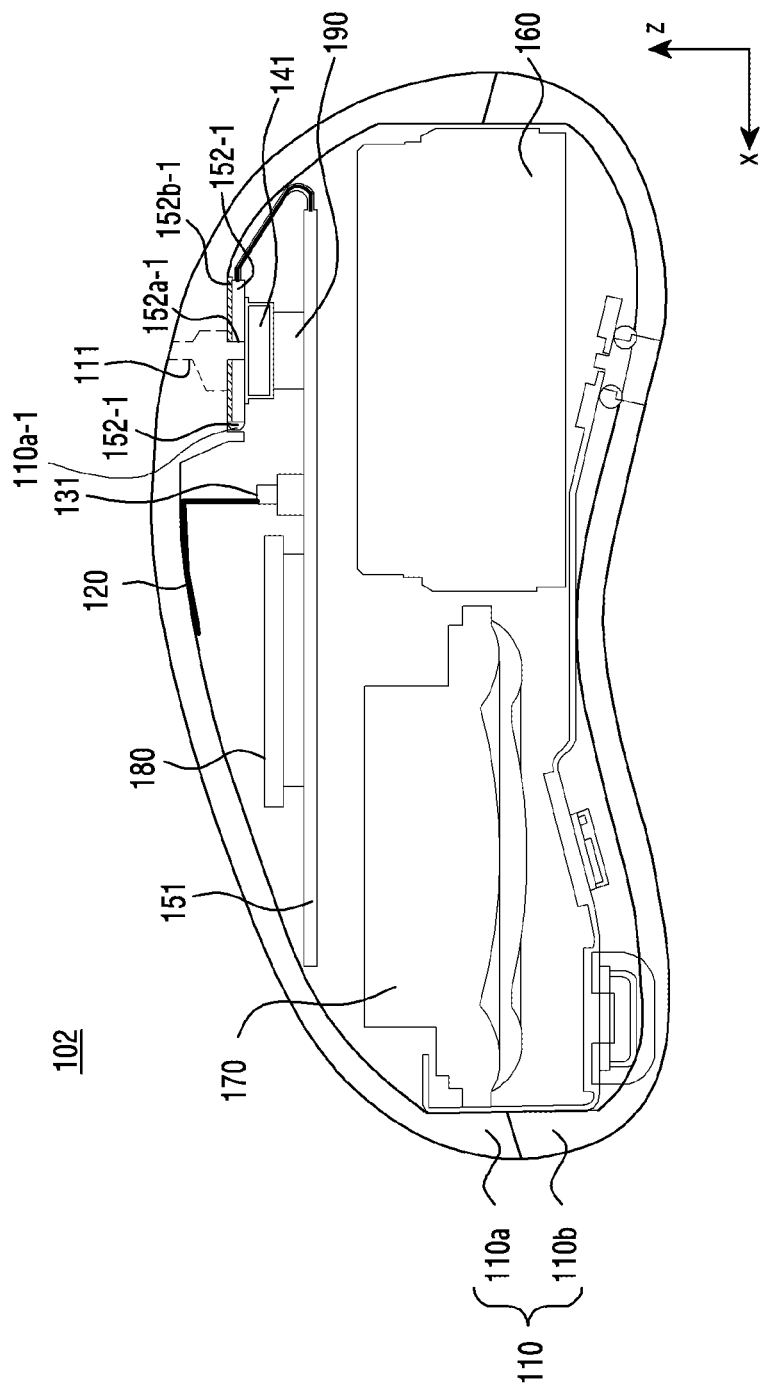
FIG. 1D is a cross-sectional view of an electronic device according to various embodiments.

FIG. 1D is a cross-sectional view of an electronic device according to various embodiments.

Referring to FIG. 1D, an electronic device 102 according to an embodiment may include a recess 110a-1 in a partial area of a first portion 110a of a housing 110 in which a second-first printed circuit board 152-1 is positioned, and a first-first microphone hole 111 may be positioned through the recess 110a-1. In addition, at least a portion of the second-first printed circuit board 152-1 may be positioned in the recess 110a-1. The electronic device 102 may have improved touch sensitivity as a first-first touch electrode 152b-1 is positioned closer to a surface of the housing 110, compared with the electronic device 101 of FIG. 1A to FIG. 1C.

Although not illustrated in FIG. 1D, in the electronic device 102, a second-second printed circuit board 152-2 may be positioned on the first portion 110a of the housing 110 and may include another recess through which a first-second microphone hole 112 is positioned. Other components of the electronic device 102 are similar to those of the electronic device 101 of FIG. 1A to FIG. 1C, and thus the detailed descriptions thereof may not be repeated.

Figure 2A:
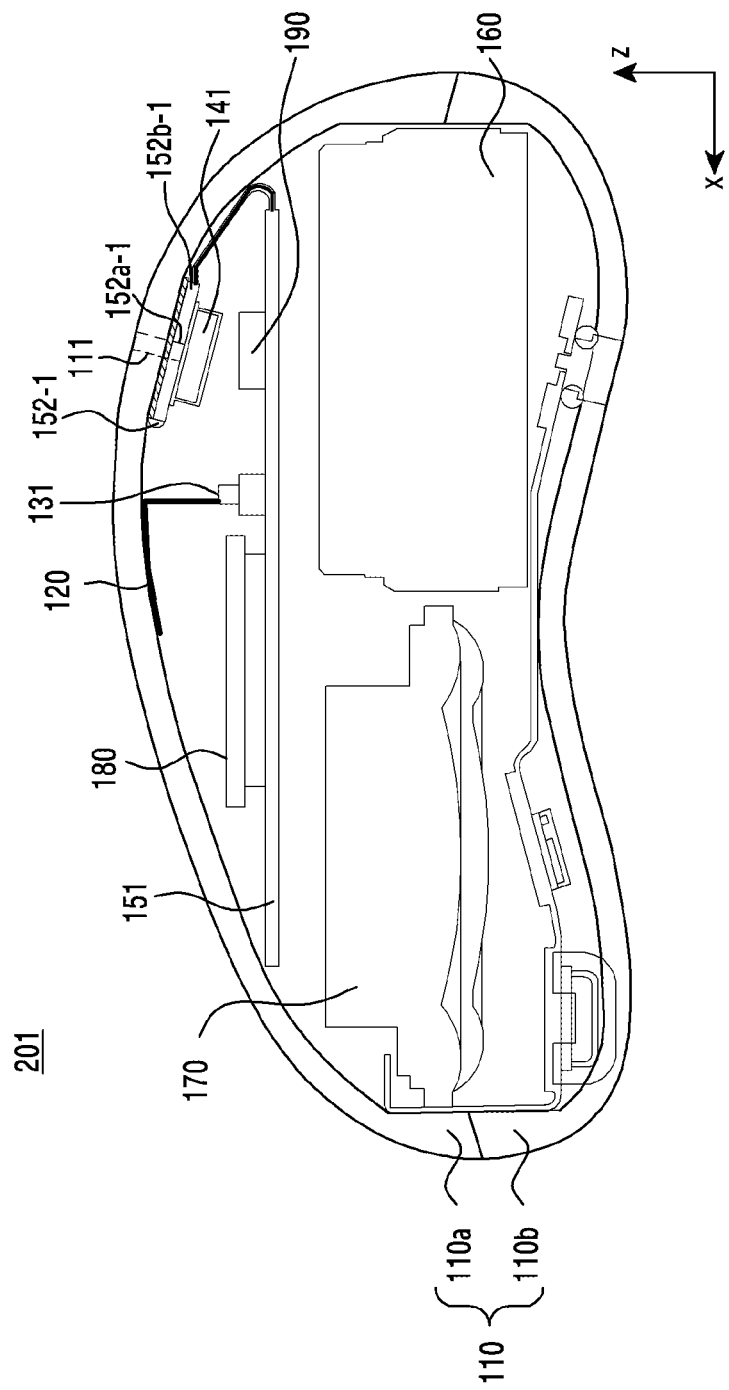
FIG. 2A is a cross-sectional view of an electronic device according to various embodiments.

FIG. 2A is a cross-sectional view of an electronic device according to various embodiments.

Referring to FIG. 2A, an electronic device 201 according to an embodiment may be similar to the electronic device 101 of FIG. 1A to FIG. 1C. In the electronic device 201 of FIG. 2A, a second-first printed circuit board 152-1 may be positioned on the inner side surface of a first portion 110a of a housing 110 not to be parallel to a first printed circuit board 151 but to be inclined by a predetermined (e.g., specified) angle with reference to the Z-axis. A first-first microphone hole 111 may be positioned not to be parallel to the Z-axis but to be inclined with reference to the Z-axis.

The electronic device 201 of FIG. 2A, described above, may have improved touch sensitivity as a first-first touch electrode 152b-1 is positioned close to the surface of the housing 110.

Figure 2B:
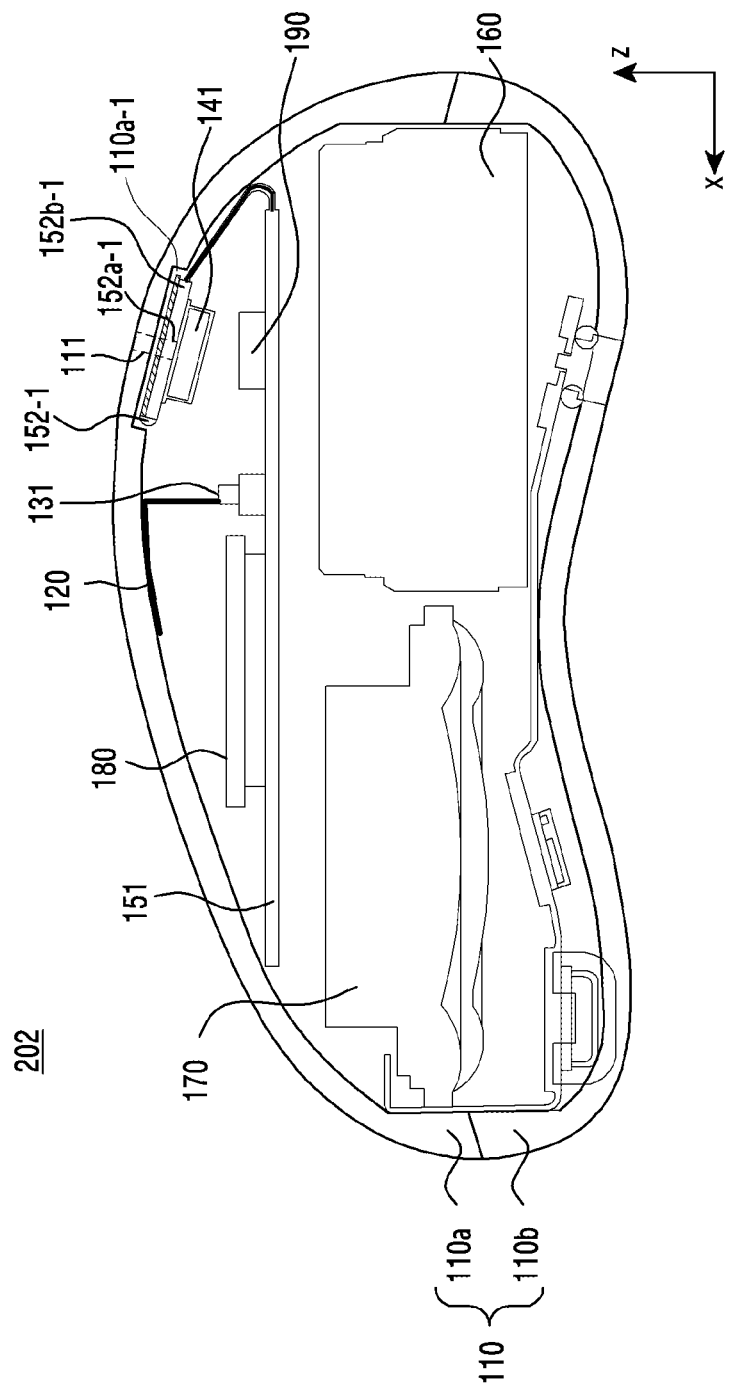
FIG. 2B is a cross-sectional view of an electronic device according to various embodiments.

FIG. 2B is a cross-sectional view of an electronic device according to various embodiments.

Referring to FIG. 2B, an electronic device 202 according to an embodiment may include a recess 110a-1 in a partial area of a first portion 110a of a housing 110 in which a second-first printed circuit board 152-1 is positioned, and a first-first microphone hole 111 may be positioned in the recess 110a-1. In addition, at least a portion of the second-first printed circuit board 152-1 may be positioned in the recess 110a-1. The electronic device 202 according to an embodiment may have improved touch sensitivity as a first-first touch electrode 152b-1 is positioned closer to a surface of the housing 110, compared with the electronic device 201.

Although not illustrated in FIG. 2B, in the electronic device 202, a second-second printed circuit board 152-2 may be positioned on the first portion 110a of the housing 110 and may include another recess through which a first-second microphone hole 112 is positioned. The electronic device 202 is similar to the electronic device 201 of FIG. 2A, and thus the detailed description of the other components may not be repeated.

Figure 3A:
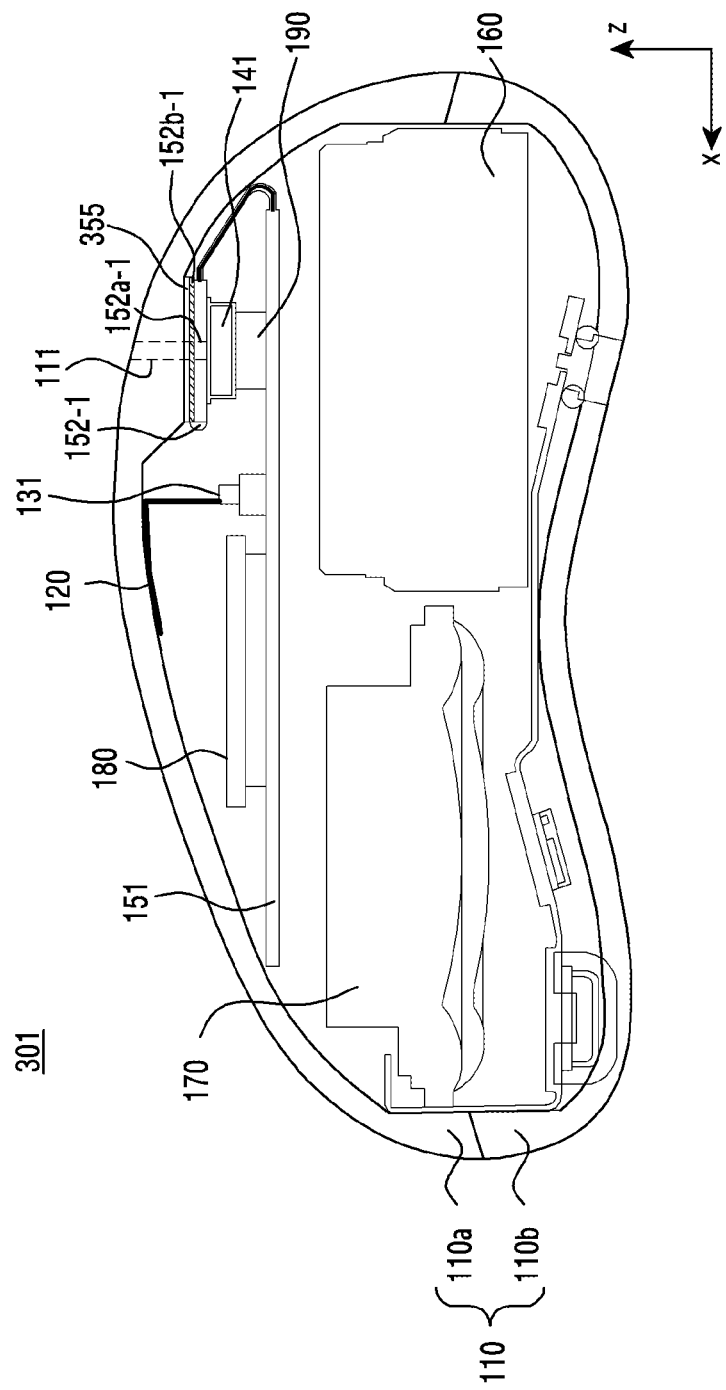
FIG. 3A is a cross-sectional view of an electronic device according to various embodiments.
Figure 3B:
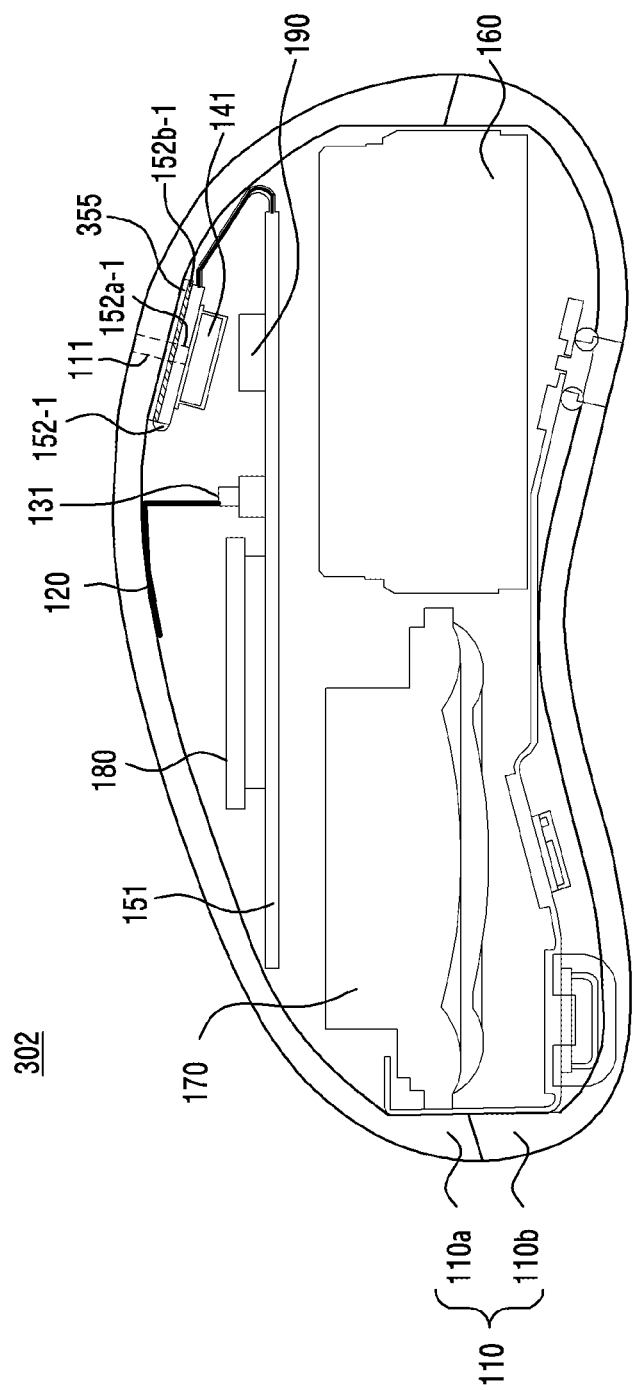
FIG. 3B is a cross-sectional view of an electronic device according to various embodiments.

FIG. 3A and FIG. 3B are cross-sectional views of an electronic device according to various embodiments.

Prior to the detailed description, hereinafter, a second-first printed circuit board 152-1 will be described as an example. However, the description below may be applied to a second-second printed circuit board 152-2.

Referring to FIG. 3A and FIG. 3B, an electronic device 301 of FIG. 3A according to an embodiment may be similar to the electronic device 101 of FIG. 1A to FIG. 1C, and an electronic device 302 of FIG. 3B may be similar to the electronic device 201 of FIG. 2A. The electronic devices 301 and 302 of FIG. 3A and FIG. 3B may further include a stiffener 355.

According to an embodiment, the stiffener 355 may be positioned on a second surface (e.g., in the +Z direction) of a second-first printed circuit board 152-1, and may reinforce the strength of an area in which a first microphone 141 of the second-first printed circuit board 152-1 is disposed.

According to an embodiment, the stiffener 355 may have conductivity and be electrically connected to a first-first touch electrode 152b-1. The electronic devices 301 and 302 according to various embodiments may use the stiffener 355 including a conductive material (e.g., special use steel (SUS)) as a touch electrode. According to an embodiment, the stiffener 355 included in the electronic devices 301 and 302 may at least partially include a conductive material, and thus may reinforce the strength of an area in which the first microphone 141 of the second-first printed circuit board 152-1 is disposed and transmit touch input of a first portion 110a of a housing 110 to the first-first touch electrode 152b-1.

According to an embodiment, the electronic devices 301 and 302 may include a recess in a partial area of the first portion 110a of the housing 110, in the same or similar manner as in the electronic devices 102 and 202 of FIG. 1D and FIG. 2B.

Figure 4A:
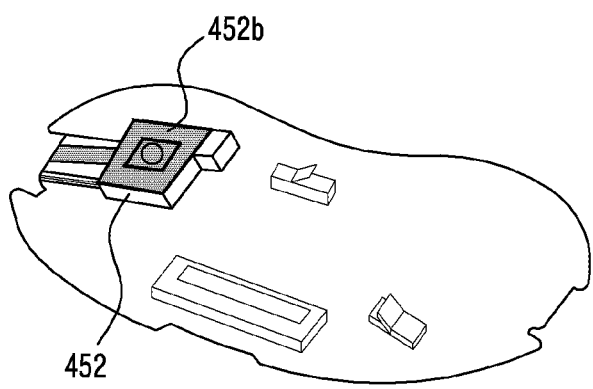
FIG. 4A is a diagram illustrating an example in which a touch electrode is disposed according to various embodiments.

FIG. 4A is a diagram illustrating an example in which a touch electrode is disposed according to various embodiments.

Referring to FIG. 4A, an electronic device (e.g., an electronic device 101, 102, 201, 202, 301, and 302) according to various embodiments may include one touch electrode 452b. The touch electrode 452b of FIG. 4A may be the same as or similar to the first-first touch electrode 152b-1 described in FIG. 1A to FIG. 3B. For example, the touch electrode 452b may be positioned on a second surface (e.g., in the +Z direction) of a second printed circuit board 452 (e.g., the second-first printed circuit board 152-1) having a microphone positioned on a first surface (e.g., in the −Z direction) thereof.

According to an embodiment, as described in FIG. 3A and FIG. 3B, the touch electrode 452b may be further connected to a stiffener (e.g., the stiffener 355).

Figure 4B:
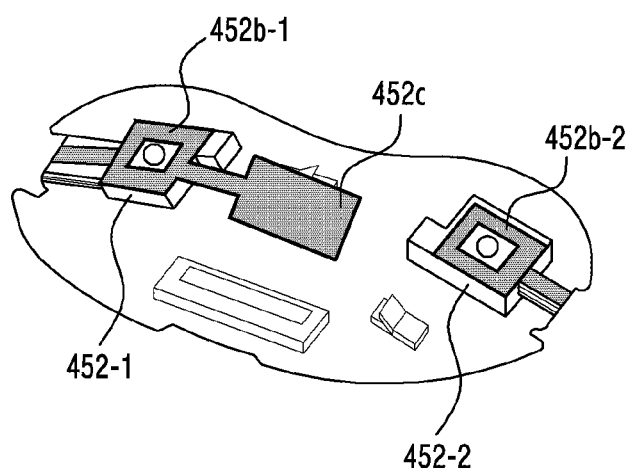
FIG. 4B is a diagram illustrating another example in which a touch electrode is disposed according to various embodiments.

FIG. 4B is a diagram illustrating an example in which a touch electrode is disposed according to various embodiments.

Referring to FIG. 4B, an electronic device (e.g., an electronic device 101, 102, 201, 202, 301, and 302) according to various embodiments may further include a first extension touch electrode 452c electrically connected to a first-first touch electrode 452b-1. The first extension touch electrode 452c may be included in a flexible printed circuit board (FPCB) connected to a second-first printed circuit board 452-1.

FIG. 4B has illustrated that the first extension touch electrode 452c is electrically connected to the first-first touch electrode 452b-1, but according to an embodiment, the first extension touch electrode 452c may be electrically connected to a first-second touch electrode 452b-2 of a second-second printed circuit board 452-2. According to an embodiment, the first extension touch electrode 452c may be electrically connected to the first-first touch electrode 452b-1 and the a first-second touch electrode 452b-2.

Figure 4C:
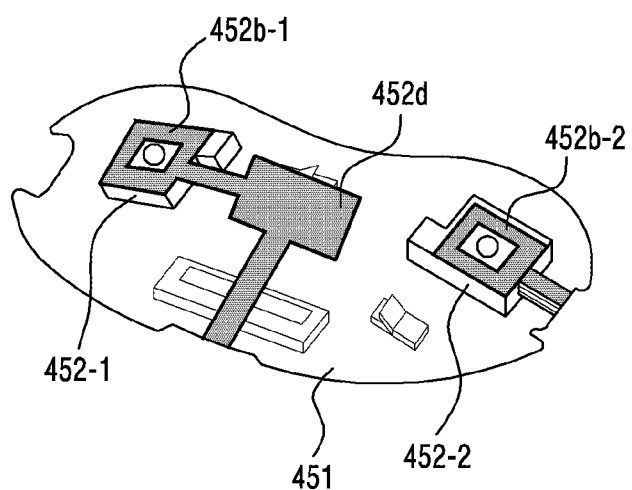
FIG. 4C is a diagram illustrating another example in which a touch electrode is disposed according to various embodiments.

FIG. 4C is a diagram illustrating an example in which a touch electrode is disposed according to various embodiments.

Referring to FIG. 4C, the first-first touch electrode 452b-1 according to various embodiments may be electrically connected to the first printed circuit board 451 via a second extension touch electrode 452d. For example, the first-first touch electrode 452b-1 may not be electrically connected to a left end portion of the first printed circuit board 451, but may be electrically connected to the first printed circuit board 451 via the second extension touch electrode 452d positioned near the center of the first printed circuit board 451. The first-second touch electrode 452b-2 may be electrically connected to the right end of the first printed circuit board 451.

According to an embodiment, the second extension touch electrode 452d may be configured by extending at least a portion of an outermost layer of multiple layers included in a flexible printed circuit board positioned between the first printed circuit board 451 and the second-first printed circuit board 452-1.

FIG. 4C illustrates that the second-second printed circuit board 452-2 is electrically connected to the first printed circuit board 451 via the second extension touch electrode 452d, but according to an embodiment, the first-second touch electrode 452b-2 of the second-second printed circuit board 452-2 may be electrically connected to the first printed circuit board 451 via the second extension touch electrode 452d, and the first-first touch electrode 452b-1 may be electrically connected to the left end portion of the first printed circuit board 451 as illustrated in FIG. 4A and FIG. 4B.

According to an embodiment, the first-first touch electrode 452b-1 and the first-second touch electrode 452b-2 may not be electrically connected to the first printed circuit board 451 via the second-first printed circuit board 452-1 and the second-second printed circuit board 452-2, and the first-first touch electrode 452b-1 and the first-second touch electrode 452b-2 may be electrically connected to the first printed circuit board 451 via the second extension touch electrode 452d.

According to an embodiment, an electronic device may include three touch electrodes or more. According to an embodiment, an electronic device may include three second printed circuit boards, a microphone may be positioned on a first surface of at least one second printed circuit board, and on a second surface thereof, a touch electrode may be positioned around a microphone hole.

Figure 5:
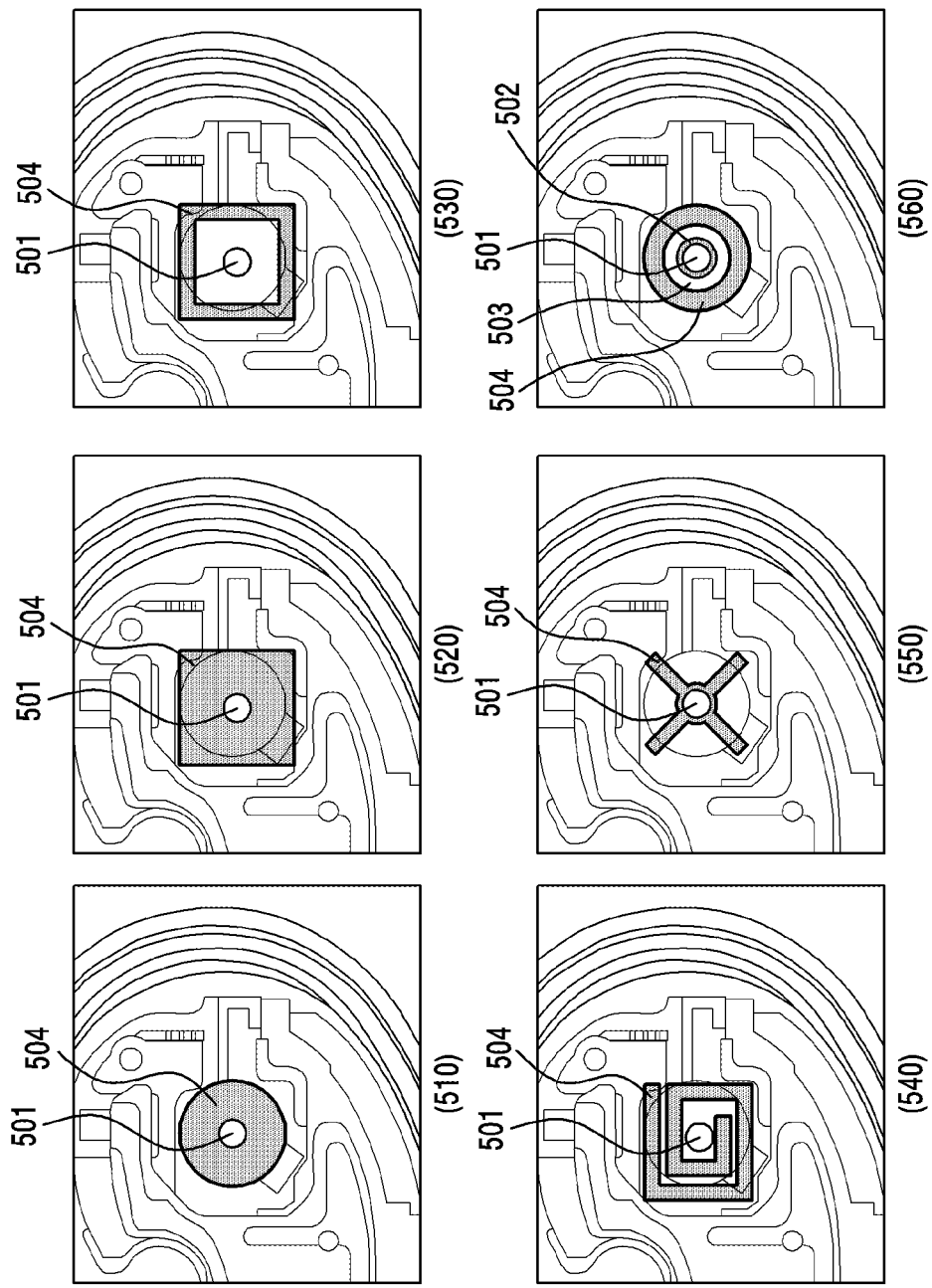
FIG. 5 is a diagram illustrating various example shapes of a touch electrode according to various embodiments.

FIG. 5 is a diagram illustrating various example shapes of a touch electrode according to various embodiments.

Referring to FIG. 5, a touch electrode 504 (e.g., a first-first touch electrode 152b-1 and/or a first-second touch electrode 152b-2) according to various embodiments may have various shapes. For example, the touch electrode 504 may have a circular shape including a microphone hole 501 as indicated by reference numeral 510 in the drawing, a quadrangular shape including a microphone hole 501 as indicated by reference numeral 520 in the drawing, a quadrangular ring shape including a microphone hole 501 being spaced apart from the quadrangular ring as indicated by reference numeral 530 in the drawing, a coil shape surrounding a microphone hole 501 as indicated by reference numeral 540 in the drawing, an X shape including a microphone hole 501 at the intersection of the X shape as indicated by reference numeral 550 in the drawing, and a circular ring shape spaced apart from a ground area 502 surrounding a microphone hole 501 as indicated by reference numeral 560 in the drawing. A non-conductive area 503 may be positioned between the ground area 502 and the touch electrode 504. The touch electrode 504 may not be limited as embodiments of FIG. 5 and may have various shapes. Although not illustrated, a ground area (e.g., the ground area 502) may be positioned between the touch electrode 504 and the microphone hole 510 illustrated in reference numerals 510 to 550, like in reference numeral 560. A non-conductive area (e.g., the non-conductive area 503) may be positioned between the ground area (e.g., the ground area 502) and the touch electrode 504.

Figure 6A:
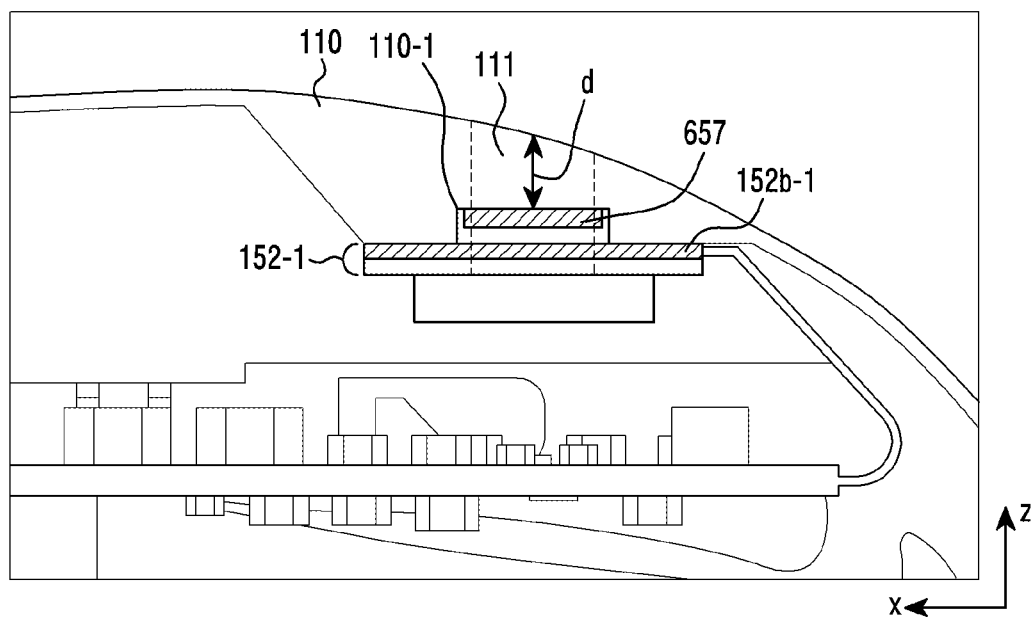
FIG. 6A is a partial sectional view illustrating an electronic device including a foreign substance prevention/reduction member according to various embodiments.

FIG. 6A is a partial sectional view illustrating an electronic device including a foreign substance prevention/reduction member according to various embodiments.

Referring to FIG. 6A, an electronic device according to an embodiment may be similar to the electronic device 101 of FIG. 1A to FIG. 1C. The electronic device of FIG. 6A may further include a foreign substance prevention/reduction member 657.

According to an embodiment, the foreign substance prevention/reduction member 657 may be positioned (disposed) between a housing 110 and a second surface (e.g., in the +Z direction) of a second-first printed circuit board 152-1 with reference to the Z-axis, and thus may prevent and/or reduce foreign matter from being introduced into the interior of the housing 110. The foreign substance prevention/reduction member 657 may be positioned in a groove (or a recess) 110-1 (refer to FIG. 6B) formed by removing (thinning) a partial area of a housing 110 being in contact with a second surface of the second-first printed circuit board 152-1. According to an embodiment, the groove 110-1 may have a shape similar to or different from a first-first microphone hole 111, and may be smaller than a partial area of the housing 110, the partial area being greater than the first-first microphone hole 111 and being in contact with a second surface of the second-first printed circuit board 152-1. According to an embodiment, the groove 110-1 may have a size in which the second surface of the second-first printed circuit board 152-1 may be positioned. For example, the second-first printed circuit board 152-1 may be positioned in the groove 110-1.

According to an embodiment, the foreign substance prevention/reduction member 657 may have conductivity and be used as a touch electrode. The foreign substance prevention/reduction member 657 may be disposed to be spaced a predetermined distance apart from the first-first touch electrode 152b-1 to operate like a capacitor. According to an embodiment, the first-first touch electrode 152b-1 and the foreign substance prevention/reduction member 657 may be electrically connected to each other via a separate member (not shown) or directly. Although not illustrated, according to an embodiment, a reinforcement member 355 may be positioned between the first-first touch electrode 152b-1 and a foreign substance prevention/reduction member 657. For example, the a first-first touch electrode 152b-1, the reinforcement member 355, and the foreign substance prevention/reduction member 657 may be electrically connected to each other. In a case where the foreign substance prevention/reduction member 657 has conductivity, the electronic device may reduce the distance d between the housing and the foreign substance prevention/reduction member, thereby improving touch sensitivity.

According to an embodiment, the foreign substance prevention/reduction member 657 and the first-first touch electrode 152b-1 may include the same material, or at least a portion of the foreign substance prevention/reduction member 657 and the first-first touch electrode 152b-1 may include a different material. For example, the foreign substance prevention/reduction member 657 and the first-first touch electrode 152b-1 may include the same material (e.g., copper) or a different material (e.g., at least one of copper, silver, gold, or aluminum). The foreign substance prevention/reduction member 657 may be conductive mesh.

Although FIG. 6A has illustrated the structure in which the foreign substance prevention/reduction member 657 is disposed in the electronic device 101 of FIG. 1A to FIG. 1C as an example, this is only for convenience of explanation, and the foreign substance prevention/reduction member 657 of FIG. 6A may be equally or similarly applied to the electronic devices 102, 201, 202, 301, and 302 of FIG. 1D to FIG. 3B.

Figure 6B:
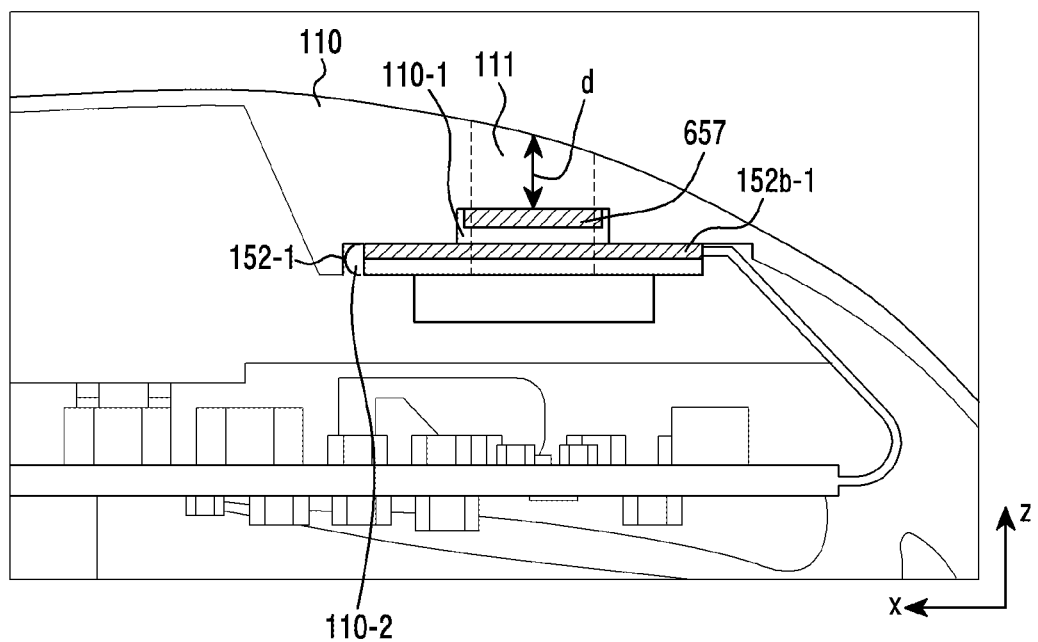
FIG. 6B is a partial sectional view illustrating an electronic device including a foreign substance prevention/reduction member according various embodiments.

FIG. 6B is a partial sectional view illustrating an electronic device including a foreign substance prevention/reduction member according to various embodiments.

Referring to 6B, the electronic device according to an embodiment may include a first groove 110-1 over which a first-first microphone hole 111 is positioned and in which a foreign substance prevention/reduction member 657 is positioned and a second groove 110-2 in which a second-first printed circuit board 152-1 is positioned, in a housing 110. The first groove 110-1 may have a size smaller than that of the second groove 110-2 and be included in the second groove 110-2 to be configured in a step shape with the second groove 110-2. According to an embodiment, the foreign substance prevention/reduction member 657 may be electrically connected to a first-first touch electrode 152b-1 via a separate member (not shown) or directly.

Figure 7A:
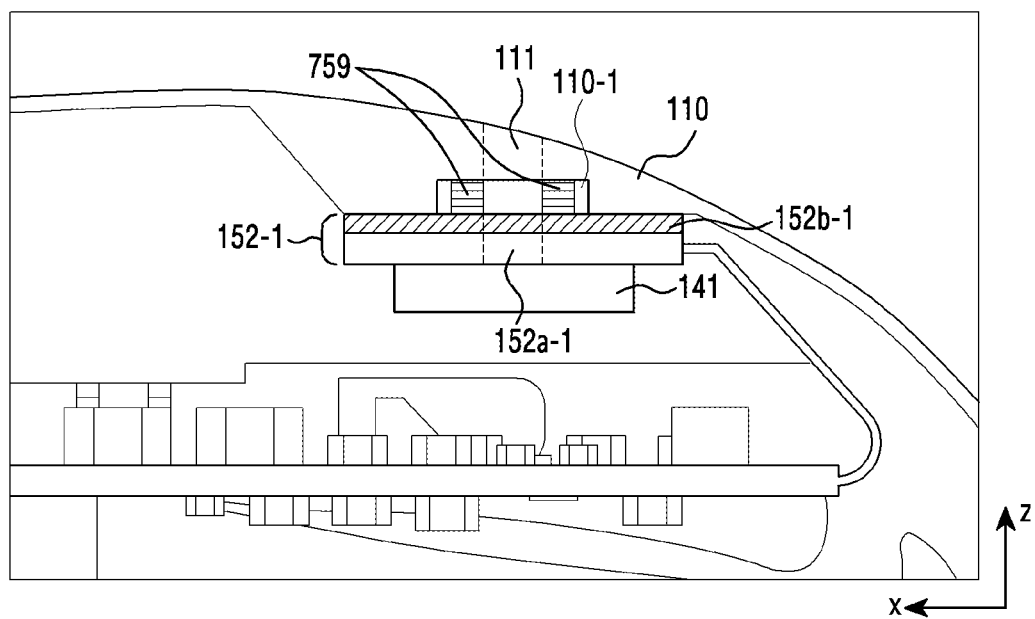
FIG. 7A is a partial sectional view illustrating an electronic device including a sound insulation member according to various embodiments.

FIG. 7A is a partial sectional view illustrating an electronic device including a sound insulation member according to various embodiments.

Referring to FIG. 7A, the electronic device according to an embodiment may be similar to the electronic device 101 of FIG. 1A to FIG. 1C. The electronic device of FIG. 7A may further include a sound insulation member (or a sound leakage prevention/reduction member including a sound insulating/reducing material) 759.

According to an embodiment, the sound insulation member 759 may include various sound absorbing/insulating materials and be positioned (disposed) in at least a portion of the space between a second-first printed circuit board 152-1 and the housing 110 with reference to the Z-axis to fill a gap between the housing 110 and a second-first printed circuit board 152-1 and form an audio path to prevent and/or reduce external sound introduced through a first-first microphone hole 111 from being diffused into the interior of the housing 110 and allow the external sound to be transmitted to a first microphone 141 through a second-first microphone hole 152a-1. The sound insulation member 759 may be positioned in a groove (or a recess) 110-1 configured by removing (e.g., thinning) a partial area of the housing 110 being in contact with a second surface of the second-first printed circuit board 152-1. The groove 110-1 may be surrounded by at least a portion of the second-first printed circuit board 152-1.

According to an embodiment, the sound insulation member 759 may have conductivity and be used as a touch electrode. For example, the sound insulation member 759 may be conductive rubber. The sound insulation member 759 may be in contact with a first-first touch electrode 152b-1 to be electrically connected thereto. In a case where the sound insulation member has conductivity, the electronic device may reduce the distance between the touch electrode (e.g., the sound insulation member 759) and a user's finger being in contact with the housing 110, thereby improving touch sensitivity.

Although not illustrated, according to an embodiment, a stiffener 355 and/or a foreign substance prevention/reduction member 657 may be positioned between the sound insulation member 759 and the first-first touch electrode 152b-1. For example, the sound insulation member 759, the stiffener 355, the foreign substance prevention/reduction member, and the first-first touch electrode 152b-1 may be electrically connected. According to an embodiment, the stiffener 355 may be positioned between the sound insulation member 759 and the first-first touch electrode 152b-1, and the foreign substance prevention/reduction member 657 may be positioned between the sound insulation member 759 and the housing 110.

Although not illustrated, according to an embodiment, a conductive pattern may be positioned around a first-first microphone hole 111 of the housing 110. For example, the conductive pattern electrically connected to the sound insulation member 759 may be positioned on a portion on which the first-first microphone hole 111 of the housing 110 is positioned or on the inner surface of the portion on which the first-first microphone hole 111 of the housing 110 is positioned. The electronic device may electrically connect the sound insulation/reduction member 759, the first-first touch electrode 152b-1, and/or the conductive pattern positioned on the inner surface of the housing 110 to improve touch sensitivity.

Although FIG. 7A has illustrated an example in which the sound insulation member 759 is disposed in the electronic device 101 of FIG. 1D to FIG. 3B, this is only for convenience of explanation, and the sound insulation member 759 of FIG. 7A may be equally or similarly applied to the electronic devices 102, 201, 202, 301, and 302 of FIG. 1D to FIG. 3B.

Figure 7B:
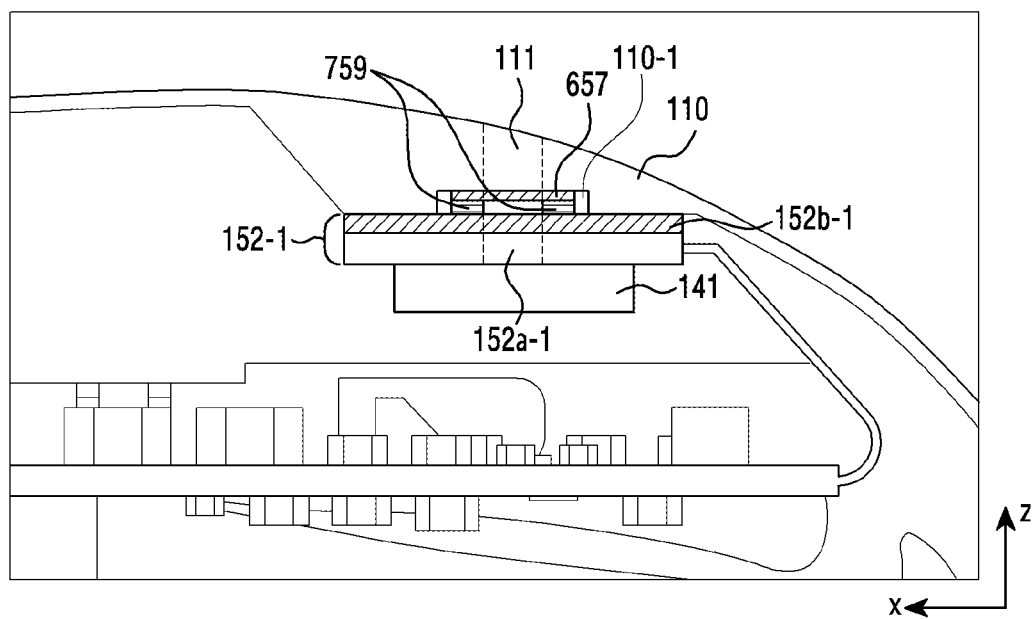
FIG. 7B is a partial sectional view illustrating an electronic device including a foreign substance prevention/reduction member and a sound insulation member according to various embodiments.

FIG. 7B is a partial sectional view illustrating an electronic device including a foreign substance prevention/reduction member and a sound insulation/reduction member according to various embodiments.

Referring to FIG. 7B, the electronic device according to an embodiment may be similar to the electronic device 101 of FIG. 1A to FIG. 1C. The electronic device of FIG. 7B may include a sound insulation member 759 and a foreign substance prevention/reduction member 657 between a second-first printed circuit board 152-1 and a housing 110, with reference to the Z-axis. For example, the sound insulation member 759 and the foreign substance prevention/reduction member 657 may be stacked on a second surface (e.g., in the +Z direction) of the second-first printed circuit board 152-1 on which a first-first touch electrode 152b-1 is positioned. The sound insulation member 759 and the foreign substance prevention/reduction member 657 may be positioned in a groove (or a recess) 110-1 formed by removing (e.g., thinning) a partial area of the housing 110 being in contact with the second surface of the second-first printed circuit board 152-1. The groove 110-1 may be surrounded by at least a portion of the second-first printed circuit board 152-1.

According to an embodiment, the sound insulation member 759 and the foreign substance prevention/reduction member 657 may be conductive. The electronic device may electrically connect the first-first touch electrode 152b-1, the sound insulation member 759, and the foreign substance prevention/reduction member 657, thereby improving touch sensitivity.

Although FIG. 7B has illustrated the structure in which the sound insulation member 759 and the foreign substance prevention/reduction member 657 are arranged in the electronic device 101 of FIG. 1A to FIG. 1C as an example, this is only for convenience of explanation, the sound insulation member 759 and the foreign substance prevention/reduction member 657 of FIG. 7B may be equally or similarly applied to the electronic devices 102, 201, 202, 301, and 302 of FIG. 1D to FIG. 3B.

Although not illustrated, according to an embodiment, the sound insulation member 759 may be positioned to surround the foreign substance prevention/reduction member 657. For example, when viewed from the Z-axis, the sound insulation member 759 may not overlap the foreign substance prevention/reduction member 657, and the foreign substance prevention/reduction member 657 may be positioned in the sound insulation member 759. For another example, the foreign substance prevention/reduction member 657 may have a size substantially the same as that of the first-first microphone hole 111, and the inner space of the sound insulation member 759 may be larger than that of the foreign substance prevention/reduction member 657.

Figure 7C:
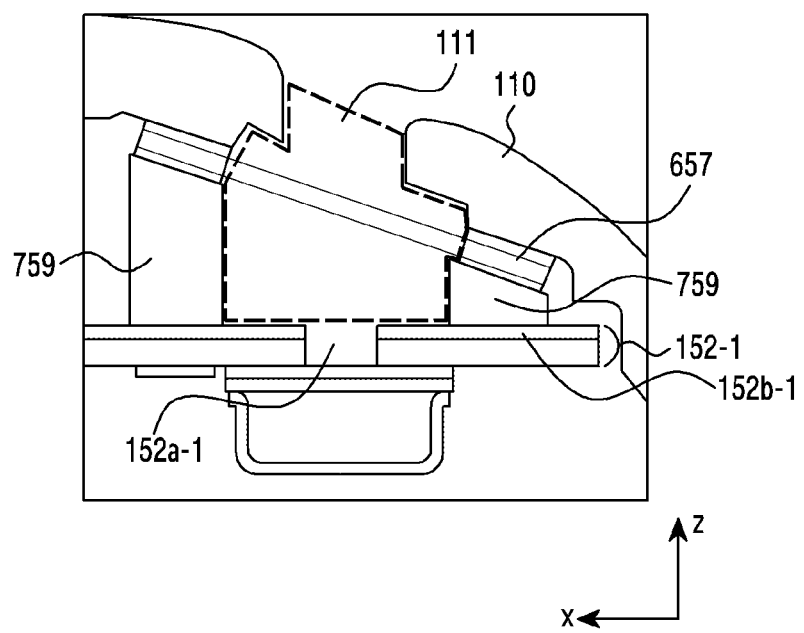
FIG. 7C is a partial sectional view illustrating an electronic device including a foreign substance prevention/reduction member and a sound insulation member according to various embodiments.

FIG. 7C is a partial sectional view illustrating an electronic device including a foreign substance prevention/reduction member and a sound insulation member according to various embodiments.

Referring to FIG. 7C, the electronic device according to an embodiment may include the sound insulation member 759 and the foreign substance prevention/reduction member 657 between a second-first printed circuit board 152-1 and a housing 110, with reference to the Z-axis. For example, the sound insulation member 759 and the foreign substance prevention/reduction member 657 may be stacked on a second surface (e.g., in the +Z direction) of the second-first printed circuit board 152-1 on which a first-first touch electrode 152b-1 is positioned. The foreign substance prevention/reduction member 657 may be positioned on the inner side surface of the housing 110 to be inclined by a predetermined angle with reference to the Z-axis. The sound insulation member 759 may form a space configured to connect a first-first microphone hole 111 and a second-first microphone hole 152a-1. The height of one side surface (e.g., a left side surface of FIG. 7C) of the sound insulation member 759 may be different from the height of the other side surface (e.g., a right side surface of FIG. 7C) thereof so as to correspond to the housing 110 inclined by a predetermined angle.

Figure 8:
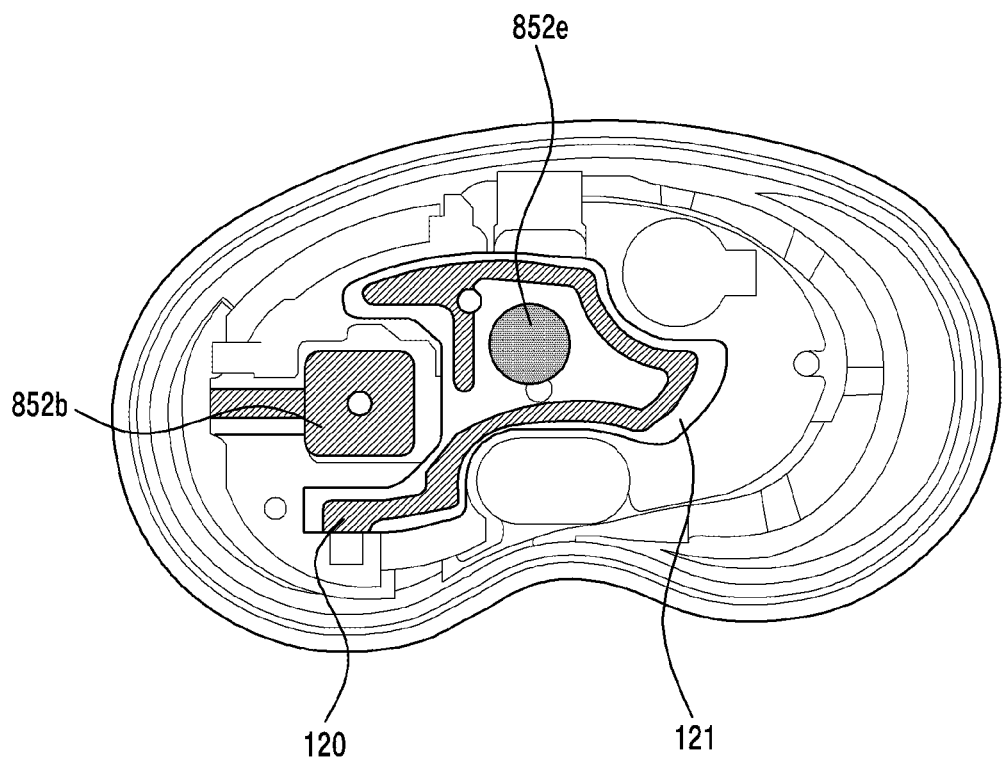
FIG. 8 is a diagram illustrating an electronic device including a plurality of touch electrodes according to various embodiments.

FIG. 8 is a diagram illustrating an electronic device including a plurality of touch electrodes according to various embodiments.

Referring to FIG. 8, the electronic device according to an embodiment may be similar to one of the electronic devices of FIG. 1A to FIG. 7B. The electronic device of FIG. 8 may further include an additional touch electrode 852e (hereinafter, a second touch electrode).

According to an embodiment, as illustrated in FIG. 8, the second touch electrode 852e may be disposed to be surrounded by a conductive pattern 120 operatable as an antenna pattern. The second touch electrode 852e may be positioned in an empty area of a base member 121 on which the conductive pattern 120 is disposed, and may be disposed to be substantially surrounded by the conductive pattern 120. In FIG. 8, although the second touch electrode 852e has been illustrated as a circular shape, the shape of the second touch electrode 852e may not be limited and be positioned in various shapes based on the shape of the conductive pattern 120.

According to an embodiment, the first touch electrode 852b (e.g., the first-first touch electrode 152b-1) and the second touch electrode 852e may be arranged adjacent to each other. For example, in a case where a user performs a first input (e.g., a touch) in the housing 110, the first touch electrode 852b and the second touch electrode 852e may be positioned to be adjacent to each other to detect a user's input substantially simultaneously.

According to an embodiment, the first touch electrode 852b and the second touch electrode 852e may be positioned to be spaced apart from each other. For example, in a case where a user performs a second input (e.g., swipe) to the housing 110, the first touch electrode 852b and the second touch electrode 852e may be positioned to be spaced apart from each other to be capable of sequentially detecting a user's input.

According to an embodiment, the conductive pattern 120 may be positioned to surround at least a portion of the first touch electrode 852b. For example, the conductive pattern 120 may be positioned to surround at least a partial area of at least one surface among a first surface, a second surface, a third surface, or a fourth surface of the quadrangular first touch electrode 852b.

The electronic device of FIG. 8, described above, may include multiple touch electrodes (e.g., the first touch electrode 852b, the second touch electrode 852e, and/or the conductive pattern 120), and thus the touch area may increase. Although not illustrated, according to an embodiment, at least a portion of the multiple touch electrodes (e.g., the first touch electrode 852b, the second touch electrode 852e, and/or the conductive pattern 120) may be electrically connected to each other.

Figure 9:
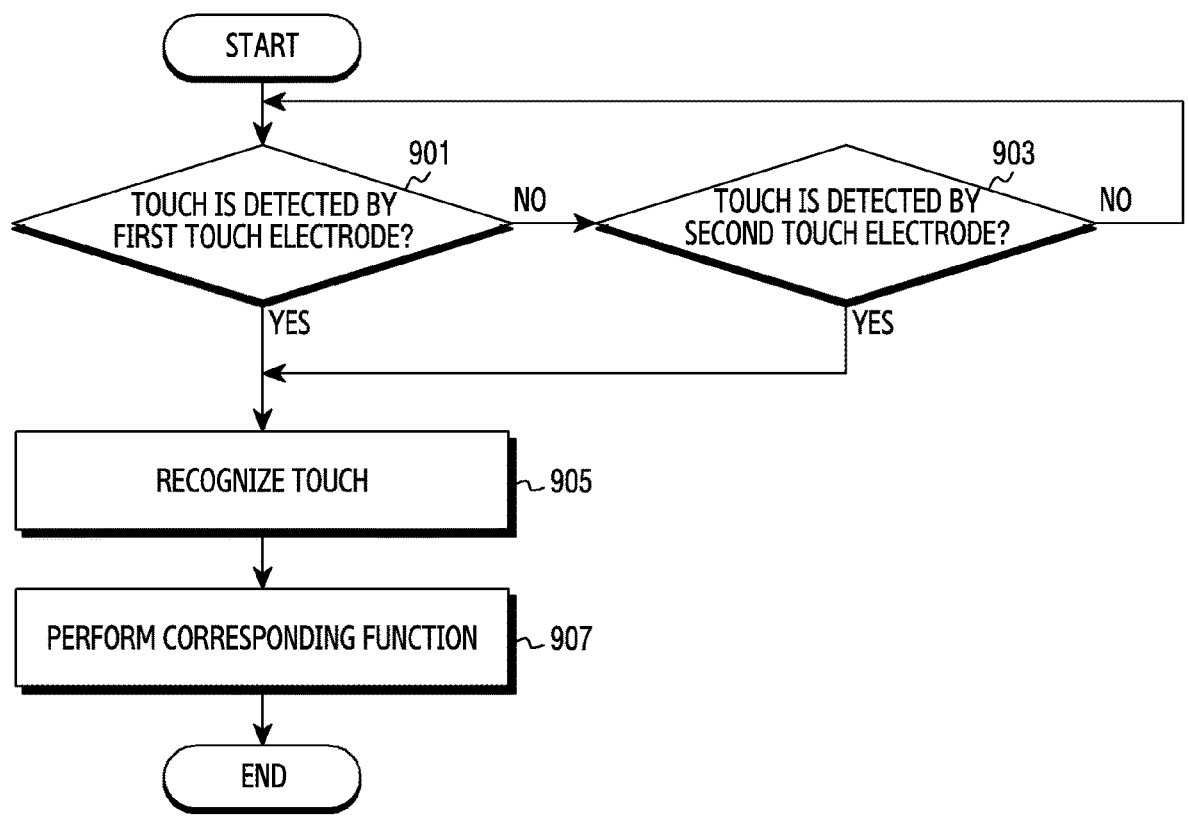
FIG. 9 is a flowchart illustrating an example method for detecting touch input of an electronic device according to various embodiments.

FIG. 9 is a flowchart illustrating an example method for detecting touch input of an electronic device according to various embodiments.

Referring to FIG. 9, in operation 901, a processor (or a touch sensor module 190) of the electronic device (e.g., an electronic device 101, 102, 201, 202, 301, and 302) according to an embodiment may identify whether a touch is detected at a first touch electrode (e.g., the first-first touch electrode 152b-1 and 452b-1, first-second touch electrode 152b-2 and 452b-2, the first extension touch electrode 452c, and/or the second extension touch electrode 452d). For example, the processor (or a touch sensor module 190) may identify whether a touch is detected at the first touch electrode (e.g., the first-first touch electrode 152b-1 and 452b-1, first-second touch electrode 152b-2 and 452b-2, the first extension touch electrode 452c, and/or the second extension touch electrode 452d) at predetermined intervals. In a case where a touch is detected by the first touch electrode as a result of identification in operation 901, the processor may proceed to operation 905 which will be described in greater detail below. On the other hand, in a case where a touch is not detected by the first touch electrode as a result of identification in operation 901, in operation 903, the processor may identify whether a touch is detected at a second touch electrode (e.g., the conductive pattern 120 or the second touch electrode 852e).

In a case where a touch is detected by the second touch electrode as a result of identification in operation 903, the processor may proceed to operation 905 which will be described in greater detail below. On the other hand, in a case where a touch is not detected by the second touch electrode as a result of identification in operation 903, the processor may return to operation 901.

The processor according to an embodiment, in operation 905, may recognize a touch. For example, the processor may recognize the kinds (e.g., a tap, a double tap, or a long touch) of detected touch.

In operation 907, the processor according to an embodiment may perform a corresponding function. For example, in a case where music is being played, the processor may transmit, according to a recognized touch type, the touch type to a connected external electronic device to perform a function such as pause, stop, or play the next song.

The electronic device may include multiple touch electrodes and detect a user's touch input via at least one touch electrode. The processor (or a touch sensor module 190) of the electronic device may be connected to the multiple touch electrodes (e.g., at least one first touch electrode (e.g., the first-first touch electrode 152b-1 and 452b-1, the first-second touch electrode 152b-2 and 452b-2, the first extension touch electrode 452c, and/or the second extension touch electrode 452d), at least one second touch electrode (e.g., the second touch electrode 852e), and/or a conductive pattern (e.g., the conductive pattern 120) via different touch detection terminals (or connection members), respectively.

According to an embodiment, at least a portion of the multiple touch electrodes may be connected to the same touch detection terminal. For example, multiple touch electrodes may be connected to one touch detection terminal. For another example, in a case where the electronic device includes five touch electrodes, a first touch electrode and a second touch electrode may be connected to a first touch detection terminal, and a third touch electrode to a fifth touch electrode may be connected to a second to a fourth touch electrode, respectively. In a case where multiple touch electrodes are connected to one detection terminal, the processor may only recognize that a touch has occurred at one of the multiple touch electrodes and may not recognize at which of the multiple touch electrodes the touch has occurred.

Figure 10:
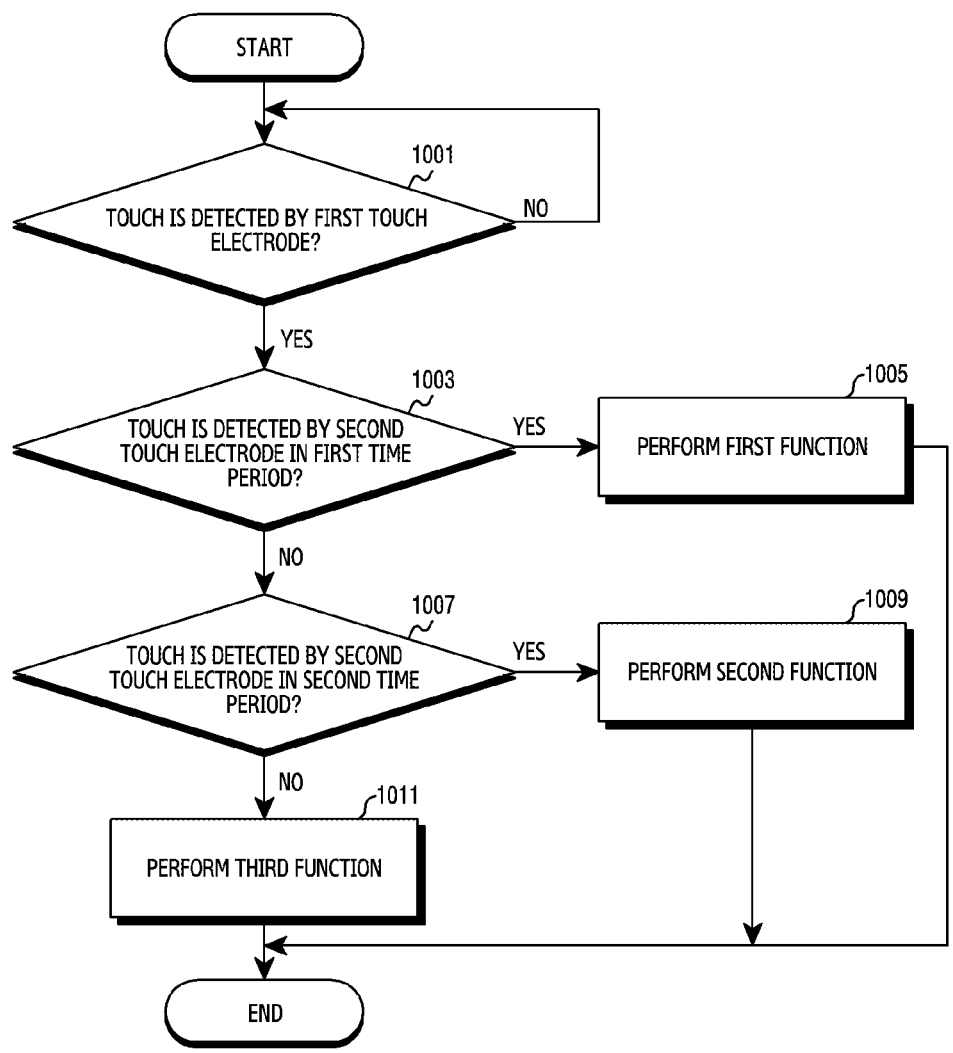
FIG. 10 is a flowchart illustrating an example method for detecting touch input of an electronic device according to various embodiments.

FIG. 10 is a flowchart illustrating an example method for detecting touch input of an electronic device according to an embodiment.

Referring to FIG. 10, in operation 1001, a processor (or a touch sensor module 190) of an electronic device (e.g., an electronic device 101, 102, 201, 202, 301, and 302) according to an embodiment may identify whether a touch is detected by one of multiple touch electrodes (hereinafter, a first touch electrode) (e.g., the first-first touch electrode 152*b*-1 and 452*b*-1, the first-second touch electrode 152*b*-2 and 452*b*-2, the first extension touch electrode 452*c*, and/or the second extension touch electrode 452*d*).

In a case where a touch is not detected by the first touch electrode as a result of identification in operation 1001, the processor may maintain operation 1001. On the other hand, in a case where a touch is detected by the first touch electrode as a result of identification in operation 1001, the processor may identify whether a touch is detected by another touch electrode (hereinafter, a second touch electrode) (e.g., the second touch electrode 852*e*) of the multiple touch electrodes in a predetermined first time period (e.g., 0.1 seconds) in operation 1003.

As a result of identification in operation 1003, in a case where a touch is detected by the second touch electrode in a predetermined first time period (e.g., in a case where a touch is detected by the first touch electrode and the second touch electrode substantially simultaneously), the processor may perform a first function (e.g., pause or play) in operation 1005. On the other hand, as a result of identification in operation 1003, in a case where a touch is not detected by the second touch electrode in a predetermined first time period, the processor may identify whether a touch is detected by the second touch electrode in a predetermined second time period (e.g., 0.5 seconds) in operation 1007.

As a result of identification in operation 1007, in a case where a touch is detected by the second touch electrode in a predetermined second time period, the processor may perform a second function (e.g., play the next song or the previous song) in operation 1009. For example, in a case where a touch is detected via a second touch detection terminal connected to the second touch electrode after the touch is detected through the first touch detection terminal connected to the first touch electrode, the processor may perform playing the next song, and in a case where a touch is detected through the first touch detection terminal connected to the first touch electrode after the touch is detected via the second touch detection terminal connected to the second touch electrode, the processor may perform playing the previous song.

As a result of identification in operation 1007, in a case where a touch is not detected by the second touch electrode in a predetermined second time period, the process may perform a third function (e.g., ignoring touch input) in operation 1011. According to an embodiment, as a result of identification in operation 1007, in a case where a touch is not detected by the second touch electrode in a predetermined second time period, the processor may perform the first function.

An electronic device (e.g., an electronic device 101, 102, 201, 202, 301, and 302) according to various example embodiments may include: a housing (e.g., a housing 110) including a first microphone hole (e.g., a first-first microphone hole 111 and a first-second microphone hole 112); a first printed circuit board (e.g., a first printed circuit board 151) positioned in the housing; a touch sensor module comprising a touch sensor (e.g., a touch sensor module 190) positioned on the first printed circuit board; at least one microphone (e.g., a first microphone 141 and a second microphone 142) configured to capture external sound; at least one second printed circuit board (e.g., a second-first printed circuit board 152-1 and 452-1, a second-second printed circuit board 152-2 and 452-2, and a second printed circuit board 452) electrically connected to the first printed circuit board, having the microphone positioned on a first surface directed to an interior of the housing, including a second microphone hole (e.g., a second-first microphone hole 152*a*-1, a second-second microphone hole 152*a*-2, and a microphone hole 501) and a first touch electrode (e.g., a first-first touch electrode 152*b*-1 and 452*b*-1, a first-second touch electrode 152*b*-2 and 452*b*-2, a touch electrode 452*b* and 504, and a first touch electrode 852*b*) positioned on a second surface opposite to the first surface to surround the second microphone hole to be electrically connected to the touch sensor module, and disposed between the housing and the first printed circuit board such that the second microphone hole corresponds to the first microphone hole; and a conductive pattern (e.g., a conductive pattern 120) surrounding at least a portion of the first touch electrode and electrically connected to the touch sensor module.

According to various example embodiments, the electronic device may further include a wireless communication module comprising communication circuitry (e.g., a wireless communication module 180) positioned on the first printed circuit board, electrically connected to the conductive pattern, and configured to transmit and/or receive a wireless signal via the conductive pattern.

According to various example embodiments, the second printed circuit board may comprise a rigid flexible printed circuit board.

According to various example embodiments, the first touch electrode may be positioned on an outermost layer of the rigid flexible printed circuit board, the rigid flexible printed circuit board including multiple layers.

According to various example embodiments, the electronic device may further include a stiffener comprising a conductive material (e.g., a stiffener 355) positioned on the second surface of the second printed circuit board, electrically connected to the first touch electrode, and having conductivity.

According to various example embodiments, the electronic device may further include a foreign substance prevention/reduction member comprising a conductive material (e.g., a foreign substance prevention/reduction member 657) disposed between the second surface of the second printed circuit board and the housing, configured to block a foreign substance from being introduced into the interior of the housing, and having conductivity.

According to various example embodiments, the foreign substance prevention/reduction member may be disposed to be spaced a specified distance apart from the first touch electrode or be electrically connected to the first touch electrode.

According to various example embodiments, the electronic device may further include a sound insulation member comprising a conductive material (e.g., a sound insulation member 759) having an audio path disposed between the first microphone hole and the second microphone hole and having conductivity.

According to various example embodiments, the electronic device may further include at least one second touch electrode (e.g., a second touch electrode 852*e*, a first extension touch electrode 452*c*, and a second extension touch electrode 452*d*) positioned between the housing and the first printed circuit board.

According to various example embodiments, the at least one second touch electrode (e.g., a first extension touch electrode 452*c*) may be electrically connected to the first touch electrode.

According to various example embodiments, the at least one second touch electrode may be electrically connected to the touch sensor module.

According to various example embodiments, the touch sensor module may be connected to the at least one first touch electrode, the at least one second touch electrode, and the conductive pattern via one touch detection terminal.

According to various example embodiments, the touch sensor module may be connected to the at least one first touch electrode, the at least one second touch electrode, and the conductive pattern via different touch detection terminals, respectively.

According to various example embodiments, the at least one second touch electrode (e.g., a second touch electrode 852e) may be positioned to be at least partially surrounded by the conductive pattern.

According to various example embodiments, the at least one microphone may include a first microphone (e.g., a first microphone 141) and a second microphone (e.g., a second microphone 142), and the at least one second printed circuit board may include a second-first printed circuit board including the first microphone and a first-first touch electrode; and a second-second printed circuit board including the second microphone and a first-second touch electrode.

According to various example embodiments, the electronic device may include an in-ear type Bluetooth device.

An electronic device (e.g., an electronic device 101, 102, 201, 202, 301, and 302) according to various example embodiments may include: a housing (e.g., a housing 110) including a first microphone hole (e.g., a first-first microphone hole 111 and a first-second microphone hole 112); a first printed circuit board (e.g., a first printed circuit board 151) positioned in the housing; a touch sensor module comprising a touch sensor (e.g., a touch sensor module 190) positioned on the first printed circuit board; at least one microphone (e.g., a first microphone 141 and a second microphone 142) configured to capture external sound; at least one second printed circuit board (e.g., a second-first printed circuit board 152-1 and 452-1, a second-second printed circuit board 152-2 and 452-2, and a second printed circuit board 452) electrically connected to the first printed circuit board, having the microphone positioned on a first surface directed to an interior of the housing, including a second microphone hole (e.g., a second-first microphone hole 152a-1, a second-second microphone hole 152a-2, and a microphone hole 501) and a touch electrode (e.g., a first-first touch electrode 152b-1 and 452b-1, a first-second touch electrode 152b-2 and 452b-2, a touch electrode 452b and 504, and a first touch electrode 852b) positioned on a second surface opposite to the first surface to surround the second microphone hole and electrically connected to the touch sensor module, and disposed between the housing and the first printed circuit board such that the second microphone hole corresponds to the first microphone hole; a connection member comprising a conductive material (e.g., a connection member 131) positioned on the first printed circuit board; and a conductive pattern (e.g., a conductive pattern 120) electrically connected to the touch sensor module positioned on the first printed circuit board via the connection member.

According to various example embodiments, the conductive pattern may be positioned to surround at least a portion of the touch electrode at an inner side surface of a first portion of the housing exposed to the outside at a time of wearing the electronic device.

According to various example embodiments, the electronic device may further include at least one among: a stiffener comprising a conductive material (e.g., a stiffener 355) positioned on a second surface of the second printed circuit board, electrically connected to the touch electrode, and having conductivity; a sound insulation member comprising a conductive material (e.g., a sound insulation member 759) having an audio path disposed between the first microphone hole and the second microphone hole and having conductivity; or a foreign substance prevention/reduction member comprising a conductive material (e.g., a foreign substance prevention/reduction member 657) having conductivity and disposed between the housing and a second surface of the second printed circuit board configured to block a foreign substance from being introduced into the interior of the housing.

An electronic device (e.g., an electronic device 101, 102, 201, 202, 301, and 302) according to various example embodiments may include: a housing (e.g., a housing 110) including a first microphone hole (e.g., a first-first microphone hole 111 and a first-second microphone hole 112); a first printed circuit board (e.g., a first printed circuit board 151) positioned in the housing; a touch sensor module comprising a touch sensor (e.g., a touch sensor module 190) positioned on the first printed circuit board; a wireless communication module comprising communication circuitry (e.g., a wireless communication module 180) positioned on the first printed circuit board and configured to transmit and/or receive a wireless signal; at least one microphone (e.g., a first microphone 141 and a second microphone 142) configured to capture external sound; at least one second printed circuit board (e.g., a second-first printed circuit board 152-1 and 452-1, a second-second printed circuit board 152-2 and 452-2, and a second printed circuit board 452) electrically connected to the first printed circuit board, having the microphone positioned on a first surface directed to an interior of the housing, including a second microphone hole (e.g., a second-first microphone hole 152a-1, a second-second microphone hole 152a-2, and a microphone hole 501) and a touch electrode (e.g., a first-first touch electrode 152b-1 and 452b-1, a first-second touch electrode 152b-2 and 452b-2, a touch electrode 452b and 504, and a first touch electrode 852b) positioned on a second surface opposite to the first surface to surround the second microphone hole to be electrically connected to the touch sensor module, and disposed between the housing and the first printed circuit board to allow the second microphone hole to correspond to the first microphone hole; and a conductive pattern (e.g., a conductive pattern 120) positioned in the housing and electrically connected to the touch sensor module and the wireless communication module.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software including one or more instructions that are stored in a storage medium that is readable by a machine (e.g., the electronic device 101, 102, 201, 202, 301, 302). For example, a processor of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by one skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a housing comprising a first microphone hole;
a first printed circuit board positioned in the housing;
a touch sensor circuit positioned on the first printed circuit board;
at least one microphone configured to capture external sound;
at least one second printed circuit board electrically connected to the first printed circuit board, wherein the at least one second printed circuit board includes a first surface facing an interior of the housing and the at least one microphone is positioned on the first surface, wherein the at least one second printed circuit board comprises a second microphone hole and a first touch electrode positioned on a second surface opposite to the first surface to surround the second microphone hole and electrically connected to the touch sensor circuit, and wherein the at least one second printed circuit board is disposed between the housing and the first printed circuit board such that the second microphone hole corresponds to the first microphone hole; and
a conductive pattern positioned to surround at least a portion of the first touch electrode and electrically connected to the touch sensor circuit.

2. The electronic device of claim 1, further comprising a wireless communication circuit positioned on the first printed circuit board, electrically connected to the conductive pattern, and configured to transmit and/or receive a wireless signal via the conductive pattern.

3. The electronic device of claim 1, wherein the at least one second printed circuit board comprises a rigid flexible printed circuit board.

4. The electronic device of claim 3, wherein the first touch electrode is positioned on an outermost layer of the rigid flexible printed circuit board, the rigid flexible printed circuit board comprising multiple layers.

5. The electronic device of claim 3, further comprising a stiffener comprising a conductive material positioned on the second surface of the at least one second printed circuit board, electrically connected to the first touch electrode, and having conductivity.

6. The electronic device of claim 1, further comprising a foreign substance prevention/reduction member comprising a conductive material disposed between the second surface of the at least one second printed circuit board and the housing, configured to block a foreign substance from being introduced into the interior of the housing, and having conductivity.

7. The electronic device of claim 6, wherein the foreign substance prevention/reduction member is disposed to be spaced a specified distance apart from the first touch electrode or is electrically connected to the first touch electrode.

8. The electronic device of claim 1, further comprising a sound insulation member comprising a conductive material, having an audio path disposed between the first microphone hole and the second microphone hole, and having conductivity.

9. The electronic device of claim 1, further comprising at least one second touch electrode positioned between the housing and the first printed circuit board.

10. The electronic device of claim 9, wherein the at least one second touch electrode is electrically connected to the first touch electrode.

11. The electronic device of claim 9, wherein the at least one second touch electrode is electrically connected to the touch sensor circuit.

12. The electronic device of claim 9, wherein the touch sensor circuit is connected to the first touch electrode, the at least one second touch electrode, and the conductive pattern via a touch detection terminal.

13. The electronic device of claim 9, wherein the touch sensor circuit is connected to the first touch electrode, the at least one second touch electrode, and the conductive pattern via different touch detection terminals, respectively.

14. The electronic device of claim 9, wherein the at least one second touch electrode is positioned to be at least partially surrounded by the conductive pattern.

15. The electronic device of claim 1, wherein the at least one microphone comprises a first microphone and a second microphone,
wherein the at least one second printed circuit board comprises:
a second-first printed circuit board comprising the first microphone and a first-first touch electrode; and
a second-second printed circuit board comprising the second microphone and a first-second touch electrode.

16. The electronic device of claim 1, wherein the electronic device includes an in-ear type Bluetooth device.

17. An electronic device comprising:
a housing comprising a first microphone hole;
a first printed circuit board positioned in the housing;
a touch sensor circuit positioned on the first printed circuit board;
at least one microphone configured to capture external sound;
at least one second printed circuit board electrically connected to the first printed circuit board, wherein the at least one second printed circuit board includes a first surface facing an interior of the housing and the at least one microphone is positioned on the first surface, wherein the at least one second printed circuit board comprises a second microphone hole and a touch electrode positioned on a second surface opposite to the first surface to surround the second microphone hole and electrically connected to the touch sensor circuit, and wherein the at least one second printed circuit board is disposed between the housing and the first printed circuit board such that the second microphone hole corresponds to the first microphone hole;
a connection member disposed on the first printed circuit board; and
a conductive pattern electrically connected to the touch sensor circuit disposed on the first printed circuit board through the connection member.

18. The electronic device of claim 17, wherein the conductive pattern is disposed to surround at least portion of the touch electrode on an inner surface of a first portion of the housing that is exposed to an outside when the electric device is worn by a user.

19. The electronic device of claim 17, further comprising at least one of:
a stiffener comprising a conductive material positioned on the second surface of the at least one second printed circuit board, electrically connected to the touch electrode, and having conductivity,
a sound insulation member comprising a conductive material, having an audio path disposed between the first microphone hole and the second microphone hole, and having conductivity, or
a foreign substance prevention/reduction member comprising a conductive material disposed between the second surface of the at least one second printed circuit board and the housing, configured to block a foreign substance from being introduced into the interior of the housing, and having conductivity.

20. An electronic device comprising:
a housing including a first microphone hole;
a first printed circuit board positioned in the housing;
a touch sensor circuit positioned on the first printed circuit board;
a wireless communication circuit positioned on the first printed circuit board and configured to transmit and/or receive a wireless signal;
at least one microphone configured to capture external sound;
at least one second printed circuit board electrically connected to the first printed circuit board, wherein the at least one second printed circuit board comprises a first surface facing an interior of the housing and the at least one microphone is positioned on the first surface, wherein the at least one second printed circuit board comprises a second microphone hole and a touch electrode positioned on a second surface opposite to the first surface to surround the second microphone hole and electrically connected to the touch sensor circuit, and wherein the at least one second printed circuit board is disposed between the housing and the first printed circuit board such that the second microphone hole corresponds to the first microphone hole; and
a conductive pattern positioned in the housing and electrically connected to the touch sensor circuit and the wireless communication circuit.

* * * * *